United States Patent
Kuo et al.

(10) Patent No.: US 11,655,146 B2
(45) Date of Patent: May 23, 2023

(54) EXTENDED ACID ETCH FOR OXIDE REMOVAL

(71) Applicant: Taiwan Semiconductor Manufacturing Company, Ltd., Hsinchu (TW)

(72) Inventors: Hong-Ta Kuo, Hsinchu County (TW); I-Shi Wang, Sanxia Township (TW); Tzu-Ping Yang, Hsinchu (TW); Hsing-Yu Wang, Hsinchu (TW); Shu-Han Chao, Hsinchu (TW); Hsi-Cheng Hsu, Taichung (TW); Yin-Tun Chou, Hsinchu (TW); Yuan-Hsin Chi, Longjing Township (TW); Sheng-Yuan Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 140 days.

(21) Appl. No.: 16/949,767

(22) Filed: Nov. 13, 2020

(65) Prior Publication Data

US 2022/0153574 A1 May 19, 2022

(51) Int. Cl.
*B81C 3/00* (2006.01)
*B81C 1/00* (2006.01)

(52) U.S. Cl.
CPC ............. *B81C 3/001* (2013.01); *B81C 1/0092* (2013.01); *B81C 2201/0133* (2013.01); *B81C 2203/036* (2013.01); *B81C 2203/0792* (2013.01)

(58) Field of Classification Search
CPC .................. B81C 3/001; B81C 1/0092; B81C 2201/0133; B81C 2203/036;
(Continued)

(56) References Cited

U.S. PATENT DOCUMENTS 8,952,465 B2 2/2015 Liang et al.
10,131,536 B2 11/2018 Cheng et al.
(Continued)

FOREIGN PATENT DOCUMENTS

CN 103539062 A 1/2014
TW 201402451 A 1/2014
(Continued)

*Primary Examiner* — Yasser A Abdelaziez
(74) *Attorney, Agent, or Firm* — Harrity & Harrity, LLP

(57) ABSTRACT

A preclean process may be omitted from a eutectic bonding sequence. To remove oxide from one or more surfaces of a device wafer of a micro-electromechanical-system (MEMS) structure, a duration of an acid-based etch process in the eutectic bonding sequence may be increased relative to the duration of the acid-based etch process when the preclean process is performed. The increased duration of the acid-based etch process enables the acid-based etch process to remove the oxide from the one or more surfaces of the device wafer without the use of a preceding preclean process. This reduces the complexity and cycle time of the eutectic bonding sequence, reduces the risk of stiction between suspended mechanical components of the MEMS structure, and/or reduces the likelihood that the MEMS structure may be rendered defective or inoperable during manufacturing, which increases process yield.

20 Claims, 23 Drawing Sheets

(58) Field of Classification Search
CPC ...... B81C 2203/0792; B81C 2201/019; B81C 1/00238; B81B 7/02
See application file for complete search history.

(56) References Cited

U.S. PATENT DOCUMENTS

| | | |
|---|---|---|
| 10,155,656 B2 | 12/2018 | Cheng et al. |
| 10,460,750 B1* | 10/2019 | Zhang ...................... G11B 5/23 |
| 10,861,693 B2 | 12/2020 | Stone et al. |
| 2006/0208326 A1* | 9/2006 | Nasiri ................. B23K 20/023 |
| | | 438/455 |
| 2007/0128831 A1* | 6/2007 | Oka ...................... B81B 3/0086 |
| | | 438/459 |
| 2017/0225948 A1 | 8/2017 | Hsin et al. |
| 2018/0016135 A1* | 1/2018 | Lee .......................... B81B 7/02 |
| 2019/0161342 A1* | 5/2019 | Tai ........................... B81B 7/02 |

FOREIGN PATENT DOCUMENTS

| | | |
|---|---|---|
| TW | 201714818 A | 5/2017 |
| TW | 201725168 A | 7/2017 |
| TW | 201732872 A | 9/2017 |

\* cited by examiner

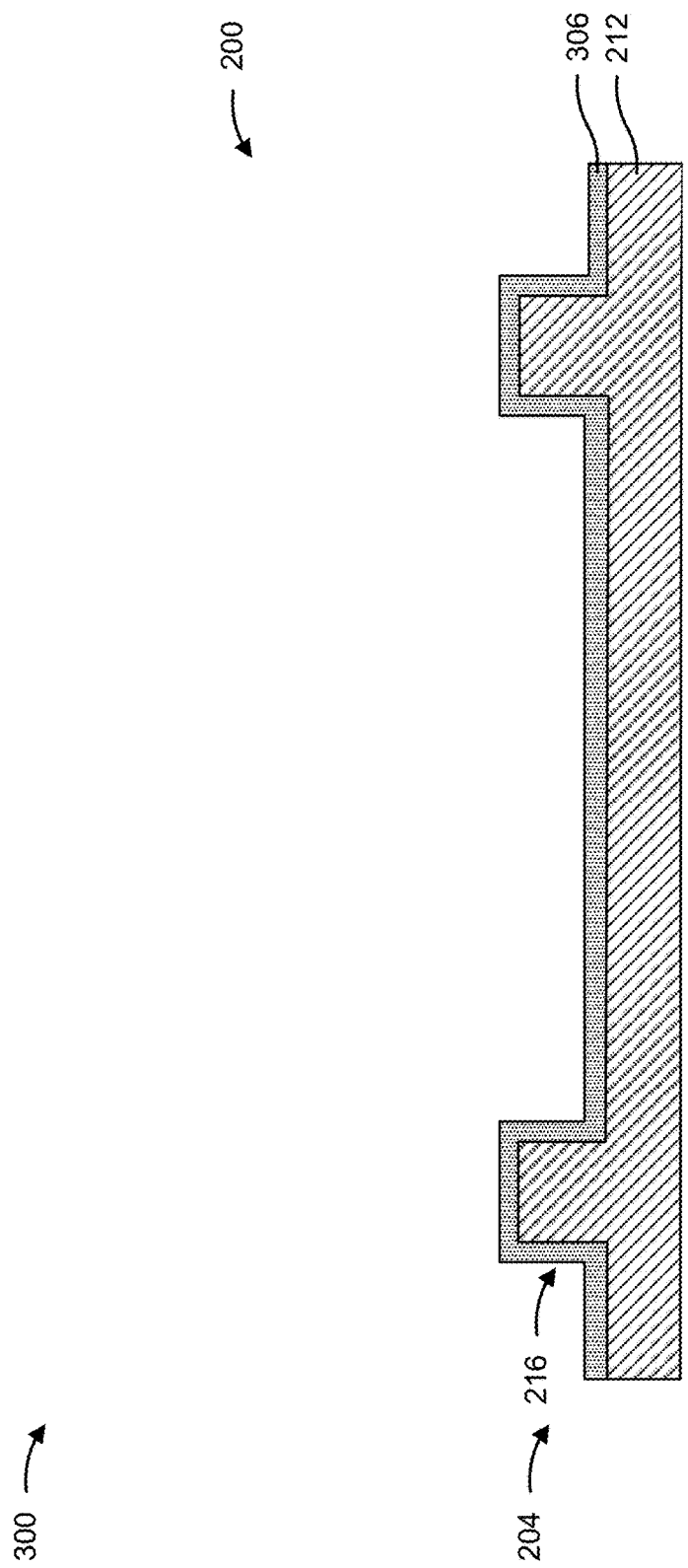

EXTENDED ACID ETCH FOR OXIDE REMOVAL

BACKGROUND

Integrated circuits may be fabricated on a semiconductor wafer. Semiconductor wafers can be stacked or bonded on top of each other to form what is referred to as a three-dimensional integrated circuit. Some semiconductor wafers include micro-electromechanical-systems (MEMS), which involves the process of forming micro-structures with dimensions in the micrometer scale (one millionth of a meter). Typically, MEMS devices are built on silicon wafers and realized in thin films of materials. MEMS applications include inertial sensors applications, such as motion sensors, accelerometers, and gyroscopes. Other MEMS applications include optical applications such as movable minors, and radio frequency (RF) applications such as RF switches and resonators.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
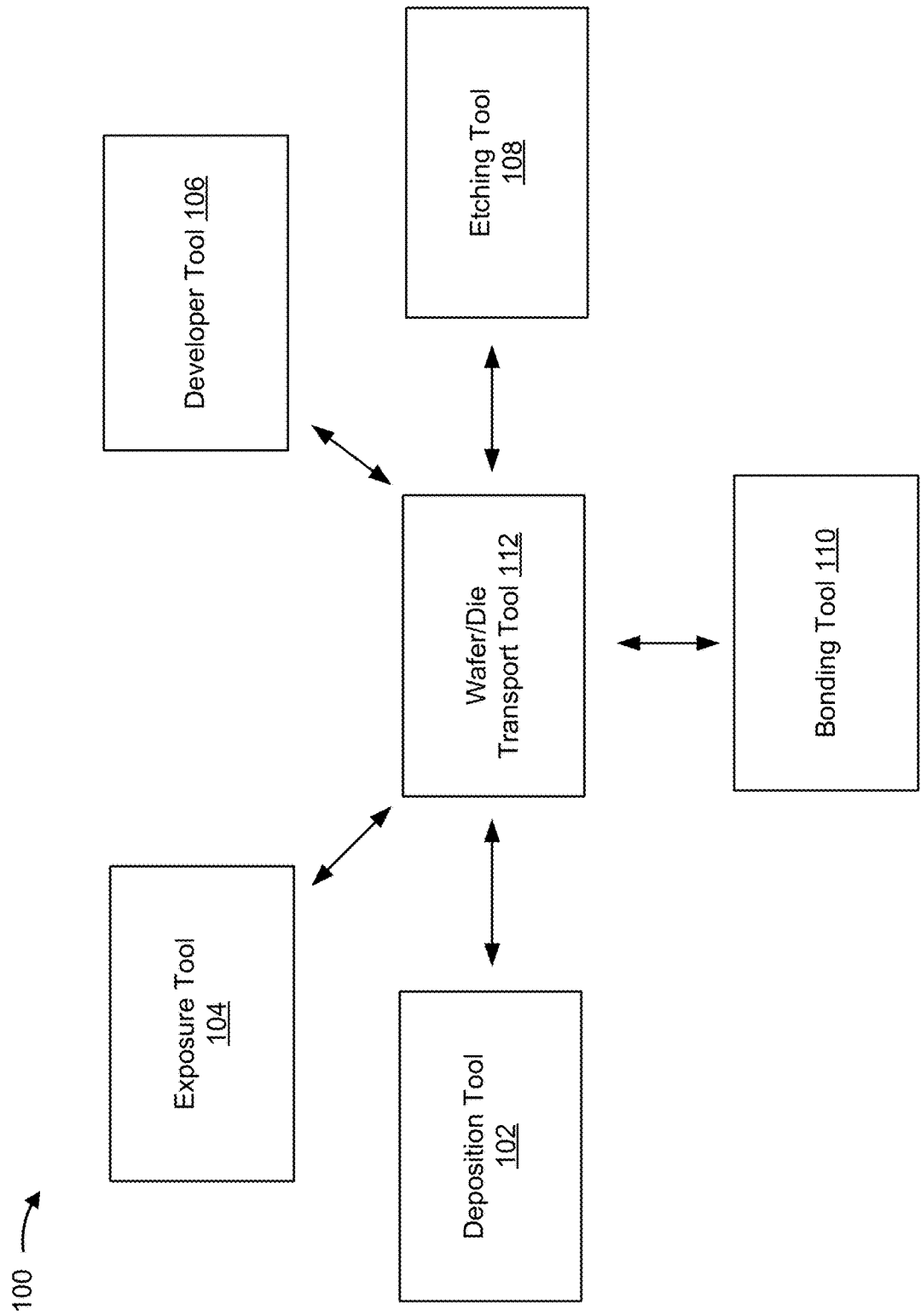
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A micro-electromechanical-system (MEMS) structure may include multiple devices or wafers that are bonded together to form the MEMS structure. For example, a MEMS structure may include a complementary metal oxide semiconductor (CMOS) wafer that includes circuitry for the MEMS structure, a device wafer that includes suspended mechanical components that function as the actuator(s) of the MEMS structure, and a cavity (or capping) wafer to seal the mechanical components in a cavity or micro-chamber. The CMOS wafer, the device wafer, and the cavity wafer may be bonded together using a eutectic bonding process. Eutectic bonding is a wafer bonding technique by which the wafers of the MEMS structure are heated to form a eutectic system between the materials of the wafers. The eutectic system typically includes silicon or germanium and a metal such as gold or aluminum. Because a eutectic system is formed, there may be no discernible interface between the bonded materials.

A eutectic bonding sequence may include a preclean process to remove an oxide (e.g., a native oxide such as silicon dioxide) from the surfaces of the device wafer prior to eutectic bonding, and an acid-based etch process to remove a preclean treatment layer from the portions of the device wafer that are to be bonded to the CMOS wafer. The MEMS structure may be placed in a preclean chamber to sputter remove the oxide. The preclean chamber may include a radio frequency (RF) generator and a coiled structure that generates the ions that are used to sputter remove the native oxides. While the preclean process may improve the quality of the eutectic bond between the wafers of the MEMS structure, the operating frequency of the RF generator may be the same as or near to the resonant frequency of the suspended mechanical components of the device wafer. As a result, the RF generator may cause the suspended mechanical components to vibrate and stick to the walls of the cavity of the MEMS structure, thereby causing the MEMS structure to be defective or inoperable.

Some implementations described herein provide techniques and apparatuses for a eutectic bonding sequence having an extended acid-based etch process for oxide removal from a semiconductor device such as a MEMS structure. In some implementations, a preclean process may be omitted from the eutectic bonding sequence. To remove the oxide from one or more surfaces of a device wafer of the MEMS structure, the duration of the acid-based etch process may be increased relative to the duration of the acid-based etch process when the preclean process is performed. As an example, the duration of the acid-based etch process may be increased from approximately 10 seconds to at least 20 seconds. The increased duration of the acid-based etch process enables the acid-based etch process to remove the oxide from the one or more surfaces of the device wafer without the use of a preceding preclean process. An acid-based etchant may be selected to provide a suitable etch rate to remove the oxide while minimizing the amount of silicon and/or germanium material that is etched from the device.

In this way, the increased duration of the acid-based etch process permits the preclean process to be omitted from the eutectic bonding sequence. This reduces the complexity and cycle time of the eutectic bonding sequence, as removing the preclean process results in fewer steps being performed in the eutectic bonding sequence. Moreover, performing the eutectic bonding sequence without the preclean process reduces the risk of stiction between the suspended mechanical components of the MEMS structure. This reduces the likelihood that the MEMS structure may be rendered defective or inoperable during manufacturing, which increases process yield.

FIG. 1 is a diagram of an example environment 100 in which systems and/or methods described herein may be implemented. As shown in FIG. 1, environment 100 may include a plurality of semiconductor processing tools 102-110 and a wafer/die transport tool 112. The plurality of semiconductor processing tools 102-110 may include a deposition tool 102, an exposure tool 104, a developer tool 106, an etching tool 108, a bonding tool 110, and/or another type of semiconductor processing tool. The tools included in example environment 100 may be included in a semiconductor clean room, a semiconductor foundry, a semiconductor processing and/or manufacturing facility, and/or the like.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light source, and/or the like), an x-ray source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etching tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of a the substrate using a plasma etch or a plasma-assisted etch, which may involve using an ionized gas to isotropically or directionally etch the one or more portions.

The bonding tool 110 is a semiconductor processing tool that is capable of bonding two or more wafers (or two or more semiconductor substrates, or two or more semiconductor devices) together. For example, the bonding tool 110 may include a eutectic bonding tool that is capable of forming a eutectic bond between two or more wafers together. In these examples, the bonding tool 110 may heat the two or more wafers to form a eutectic system between the materials of the two or more wafers.

Wafer/die transport tool 112 includes a mobile robot, a robot arm, a tram or rail car, and/or another type of device that are used to transport wafers and/or dies between semiconductor processing tools 102-110 and/or to and from other locations such as a wafer rack, a storage room, and/or the like. In some implementations, wafer/die transport tool 112 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
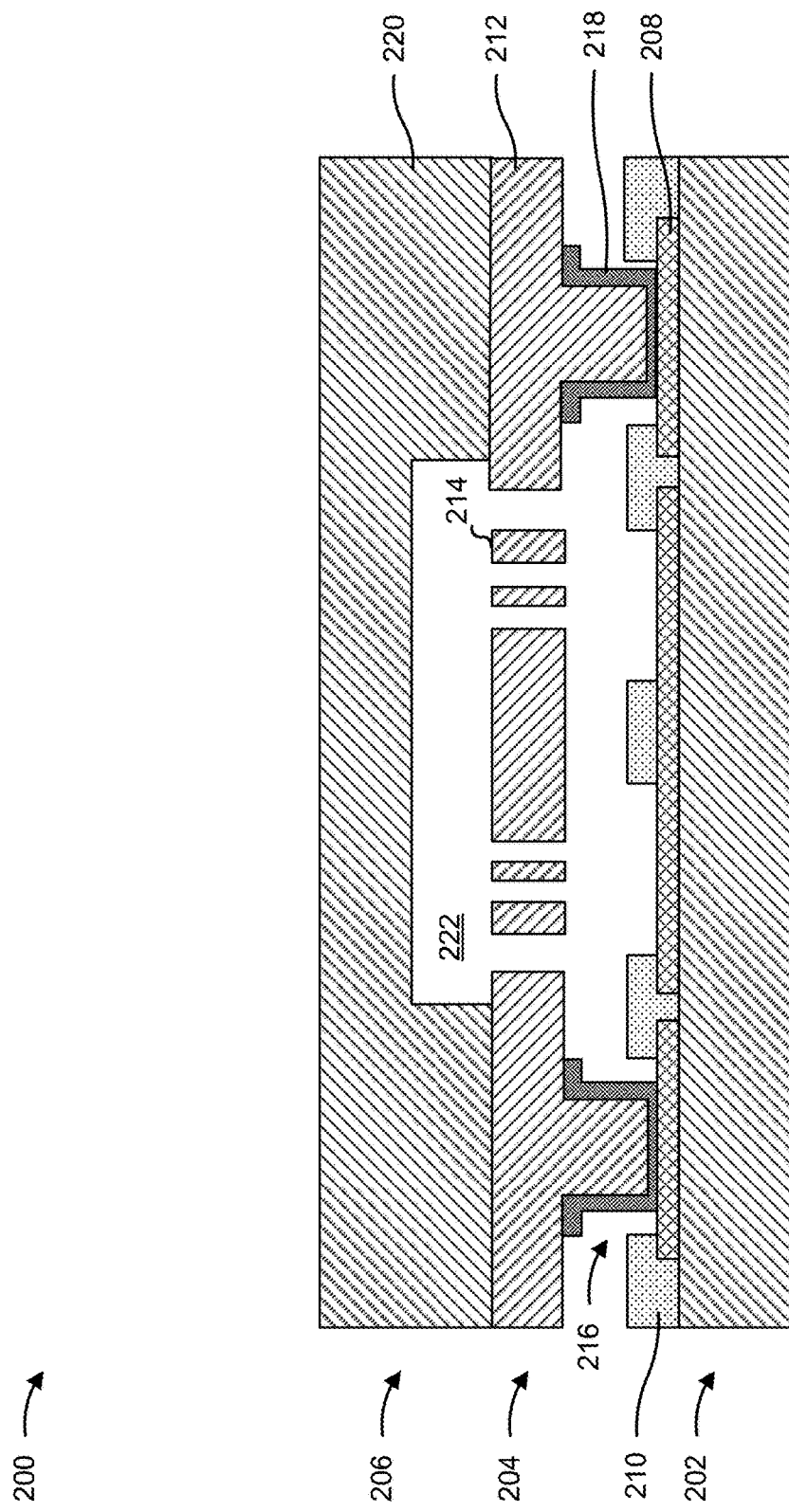
FIG. 2 is a diagram of an example micro-electromechanical-system (MEMS) structure described herein.

FIG. 2 is a diagram of an example MEMS structure 200 described herein. As shown in FIG. 2, MEMS structure 200 may include a CMOS wafer 202, a device wafer 204, and a capping wafer 206. The CMOS wafer 202 may be bonded with the device wafer 204 on a first side of the device wafer 204, and the capping wafer 206 may be bonded with the device wafer 204 on a second side of the device wafer 204 opposing the first side.

The CMOS wafer 202 may be a circuitry wafer that includes semiconductor components such as transistors, inductors, capacitors, and/or resistors; that includes integrated circuits; and/or that includes interconnecting metallization layers of the MEMS structure 200. The CMOS wafer 202 may include metal pads 208 formed of aluminum or another conductive material such as gold. The metal pads 208 may be bonding pads for the device wafer 204 and may provide electrical connections to the circuitry and interconnecting metallization layers of the MEMS structure 200. Passivation layers 210 may be disposed between and partially on adjacent metal pads to provide electrical isolation. Passivation layers 210 may be formed of a dielectric material, such as a silicon nitride ($SiN_x$), a silicon carbide ($SiC_x$), or a mixture thereof, such as a silicon carbon nitride (SiCN), a silicon oxynitride (SiON), or another dielectric material. In some implementations, the CMOS wafer 202 may include connections to packaging or solder pads of the MEMS structure 200.

The device wafer 204 is formed from a semiconductor substrate 212 such as a silicon substrate. One or more actuators 214 may be formed in the device wafer 204, which may function as the MEMS actuators for the MEMS structure 200. The one or more actuators 214 may be formed by etching through portions of the substrate 212 to form elongated members that are suspended above the CMOS wafer 202 by a lateral connection to a side of the substrate 212 of the device wafer 204. In this way, the one or more actuators 214 are permitted to displace to function as vibrating masses, elastic strings or coils, or other types of actuators for performing functions in sensors, gyroscopes, accelerometers, RF devices, or optical devices.

The device wafer 204 may be supported on the CMOS wafer 202 by a plurality of support structures 216 formed on the substrate 212. The support structures 216 may function as standoffs for the one or more actuators 214 such that the one or more actuators 214 are permitted to be suspended above the CMOS wafer 202. Each support structure 216 may be coated with a respective germanium layer 218 such that a plurality of germanium layers 218 are formed on the substrate 212. The germanium layers 218 may increase the quality and strength of the bond between the CMOS wafer 202 and the device wafer 204. In particular, a eutectic bond may be formed between the germanium layers 218 and the metal pads 208 (e.g., between respective sets of a germanium layer 218 and a metal pad 208).

The capping wafer 206 may include a substrate 220 formed from a silicon wafer or another type of wafer that is used in semiconductor processing that is capable of being etched and having mechanical strength and material composition to form a cavity 222 within the MEMS structure 200. The cavity 222 may be a hermetically sealed microchamber in which a vacuum is formed to prevent outgassing and to prevent foreign objects and other contamination from damaging the one or more actuators 214. The cavity 222 may be formed from the combination of the CMOS wafer 202, the device wafer 204, and the capping wafer 206, which may enclose the one or more actuators 214 in the cavity 222.

The number and arrangement of structures, layers, and/or the like shown in FIG. 2 is provided as an example. In practice, a MEMS structure may include additional structures and/or layers, fewer structures and/or layers, different structures and/or layers, or differently arranged structures and/or layers than those shown in FIG. 2.

Figure 3A:
FIGS. 3A-3P are diagrams of an example of forming the MEMS structure of FIG. 2.
Figure 3B:
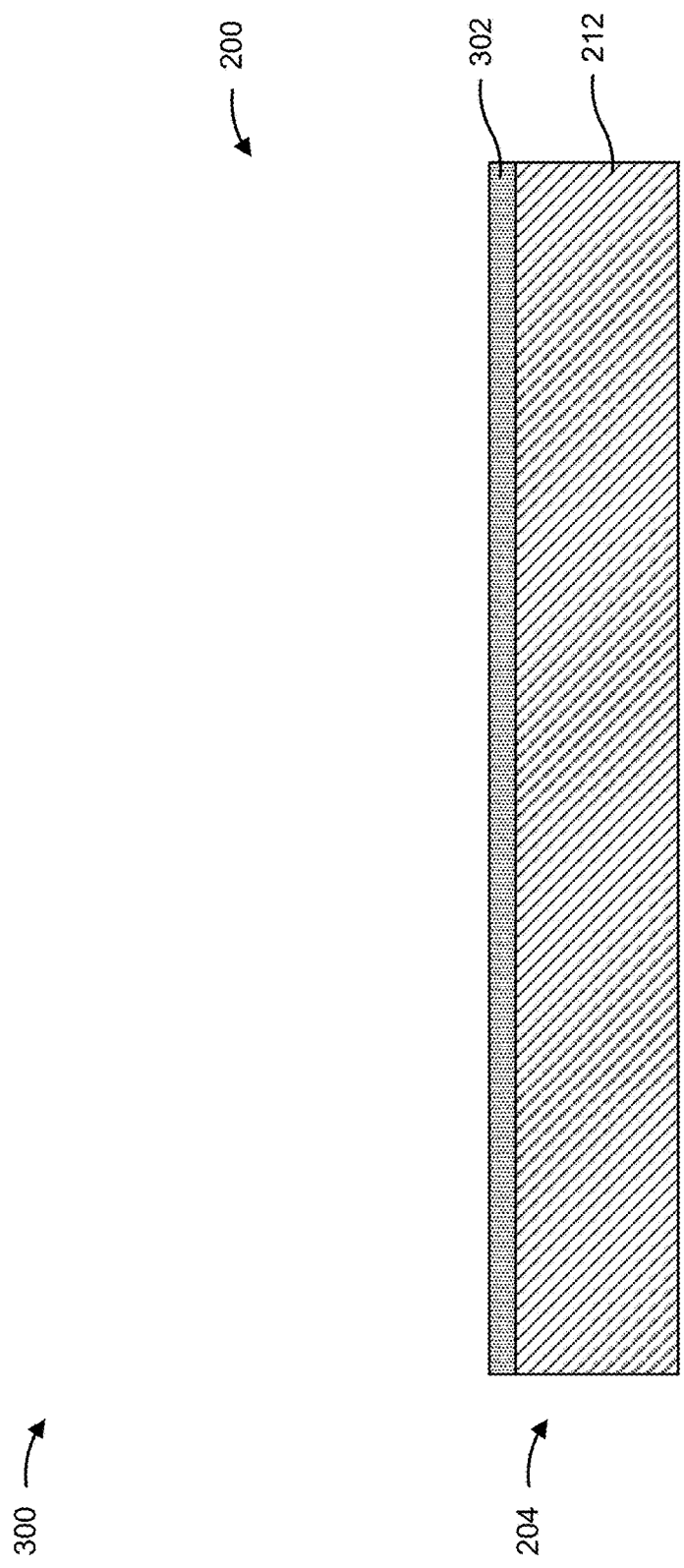
Figure 3C:
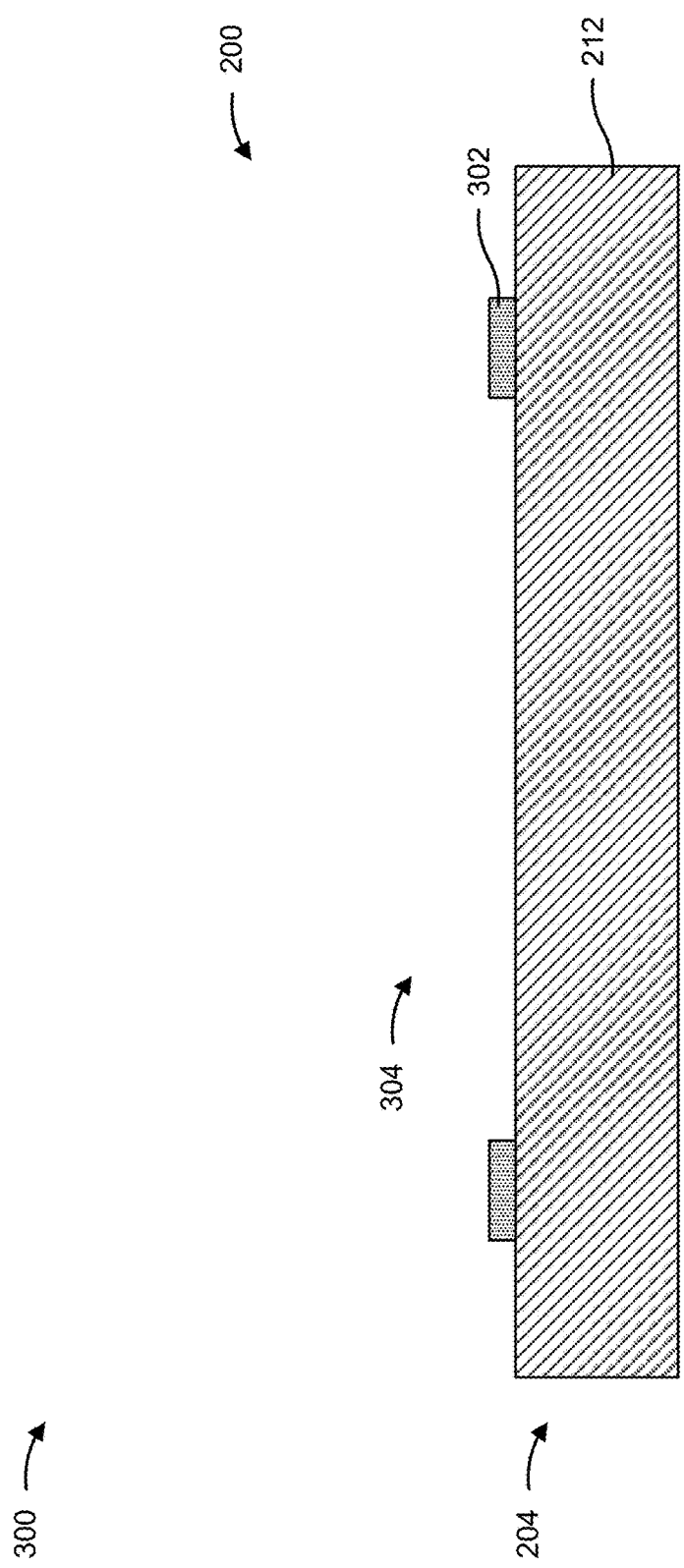
Figure 3D:
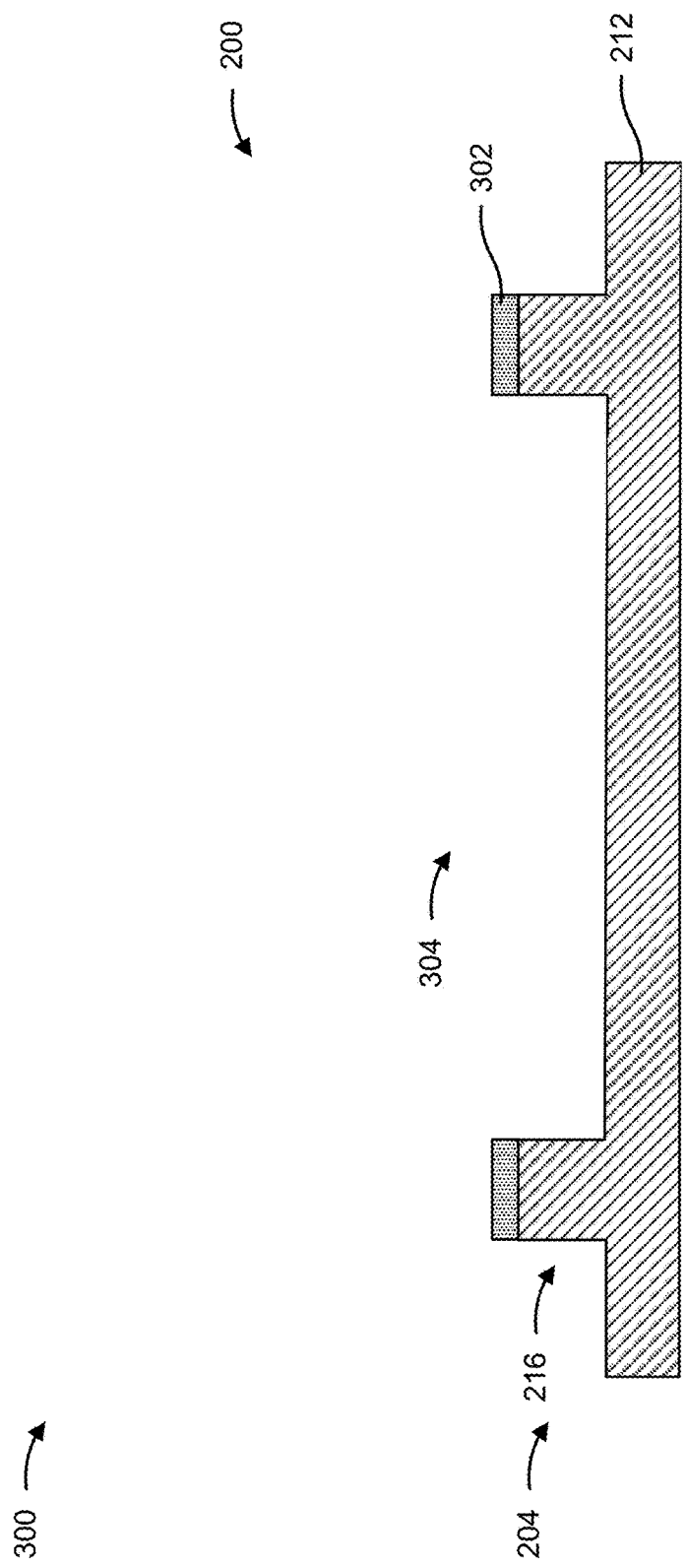
Figure 3E:
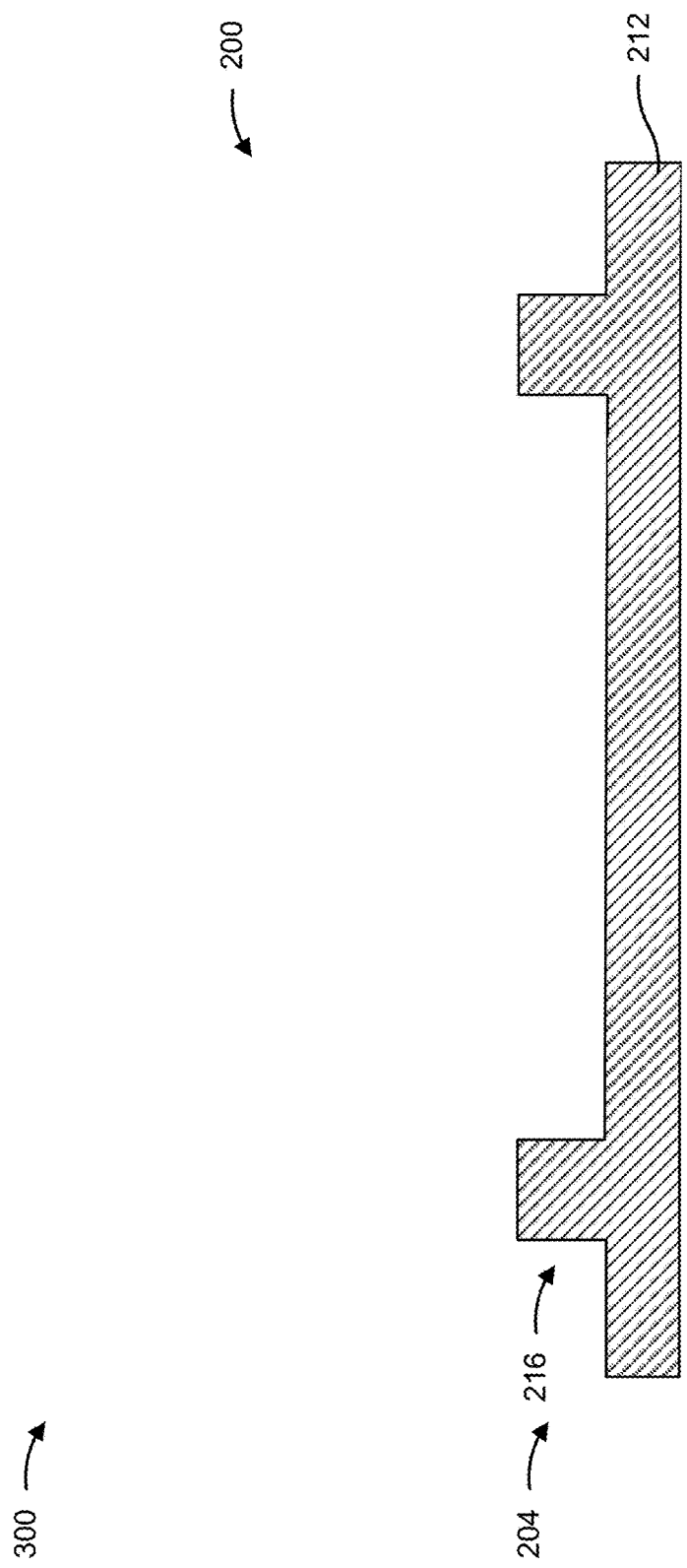
Figure 3G:
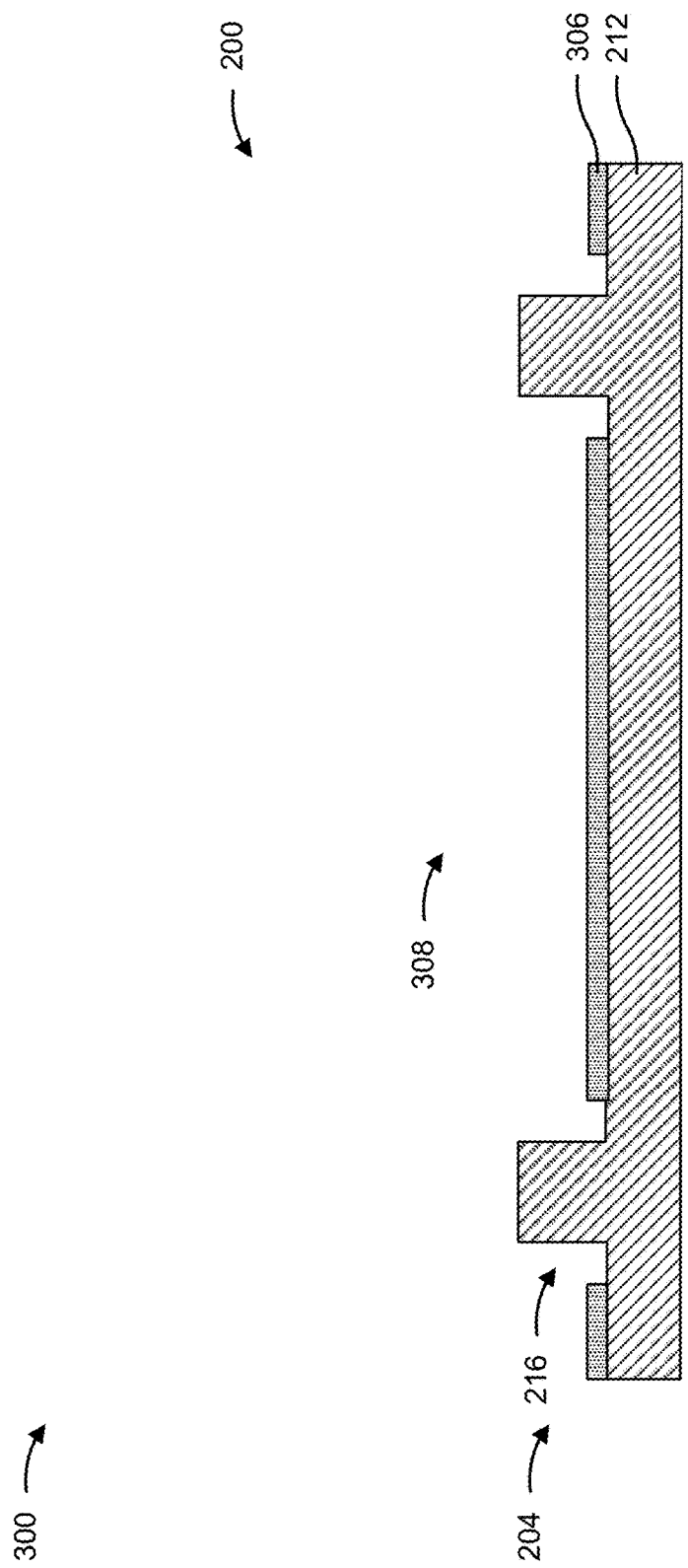
Figure 3H:
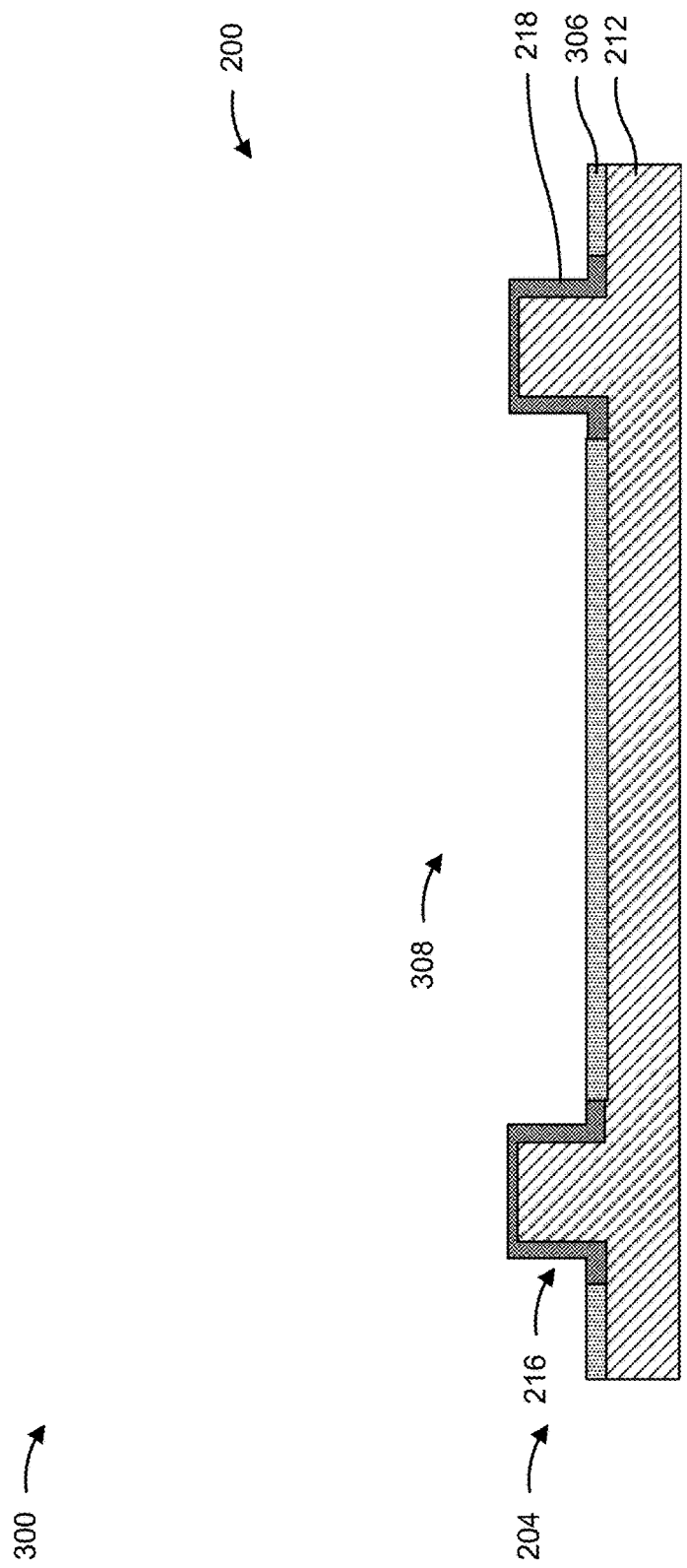
Figure 3I:
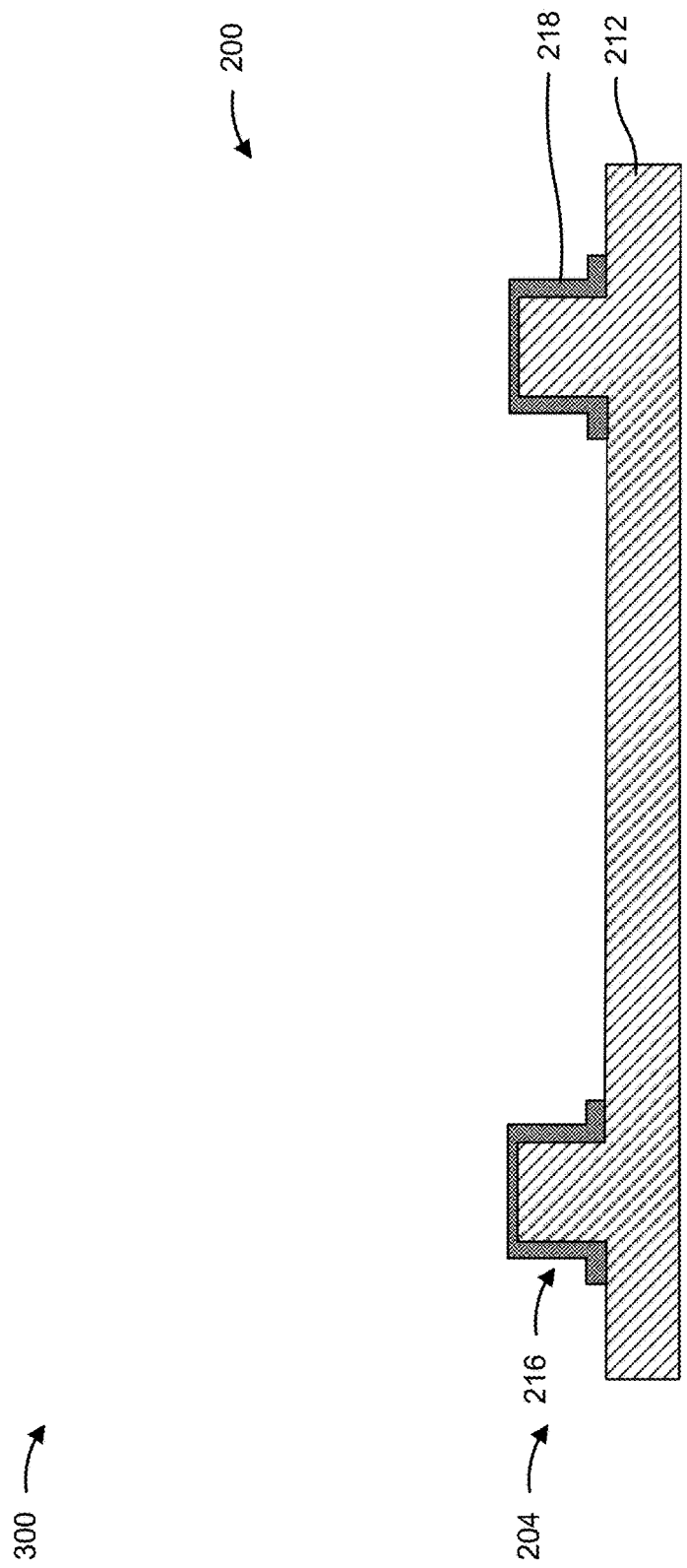
Figure 3J:
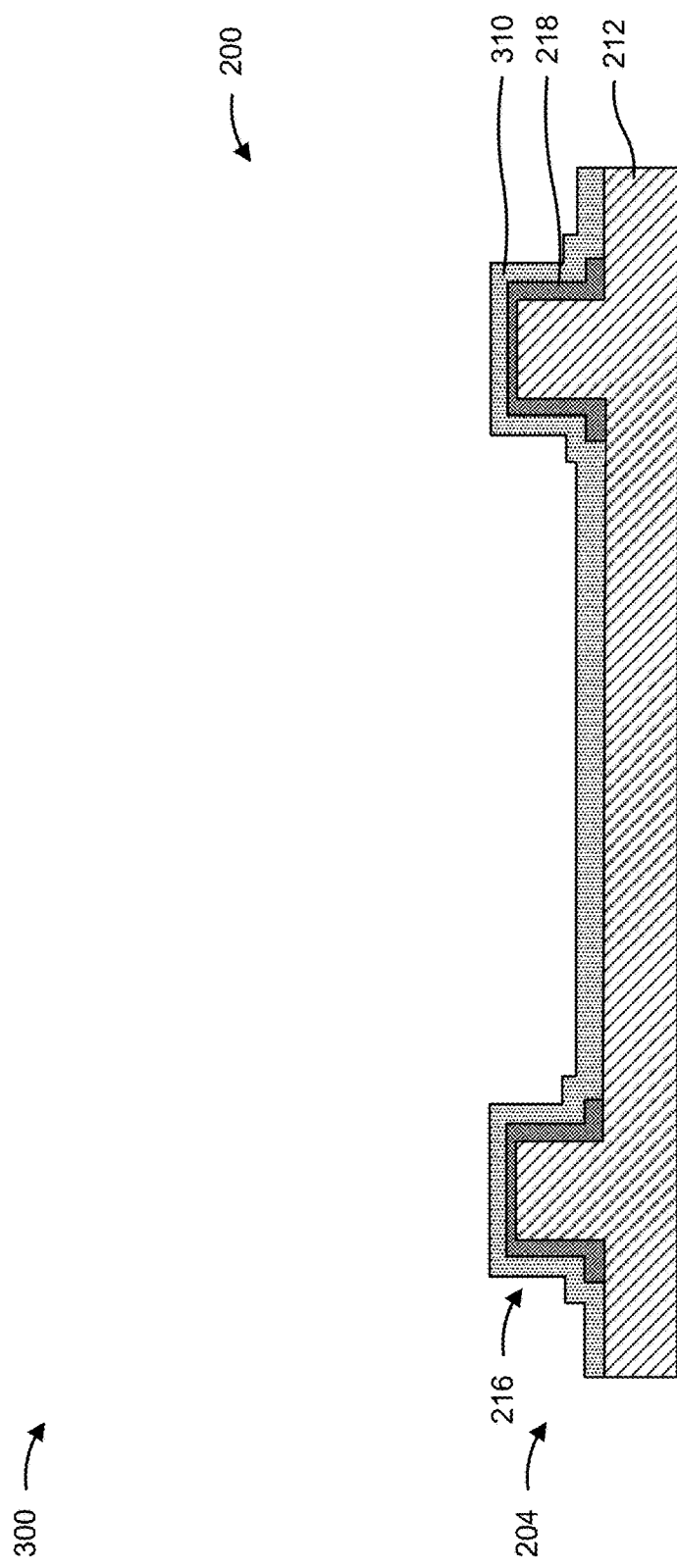
Figure 3K:
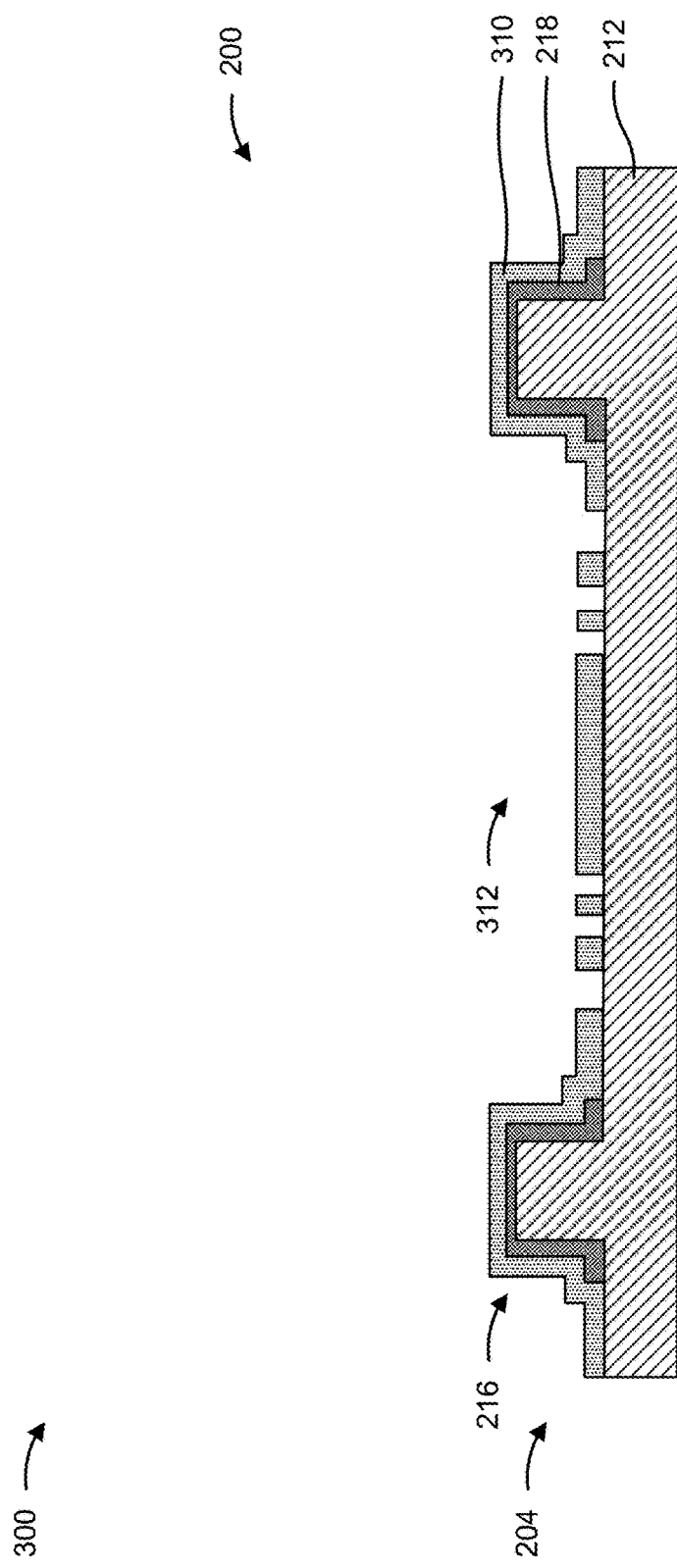
Figure 3L:
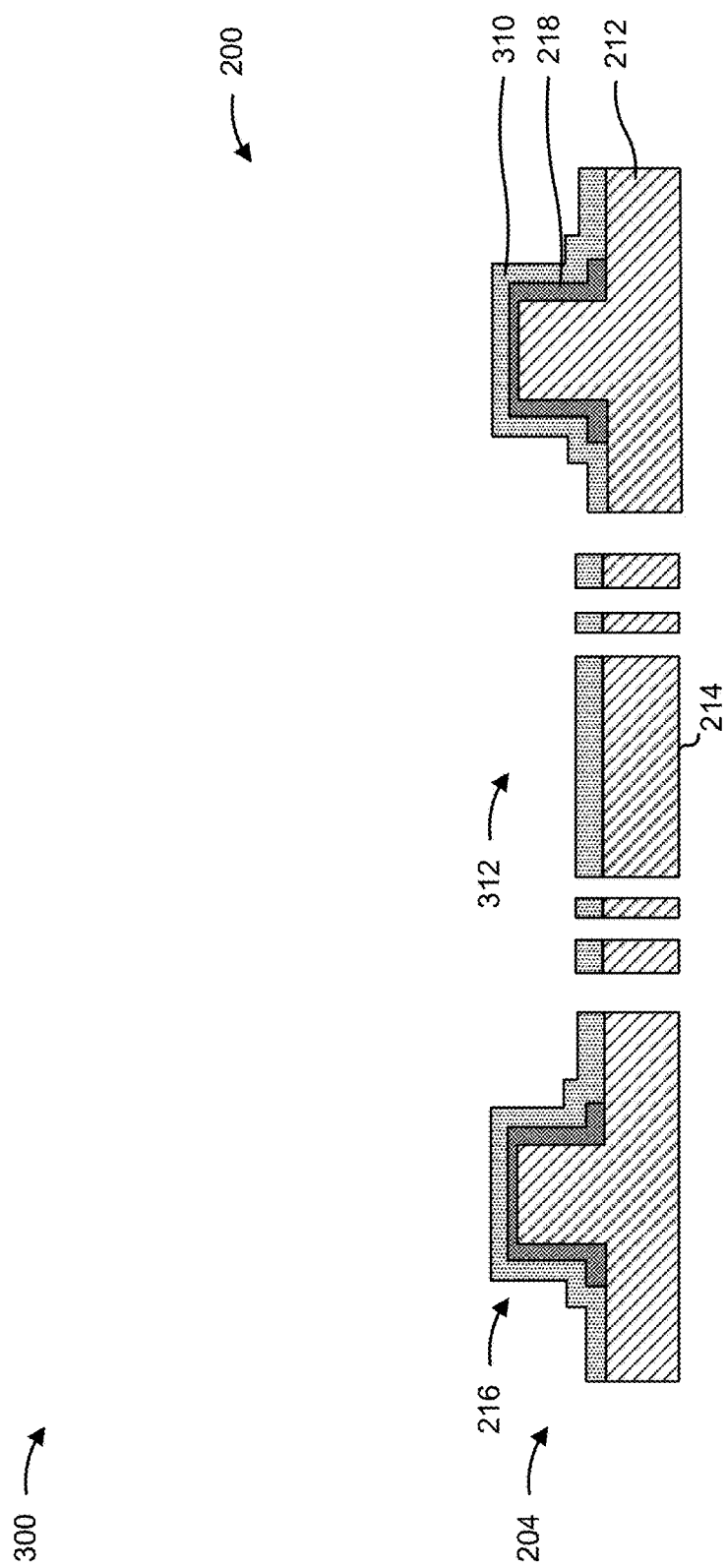
Figure 3M:
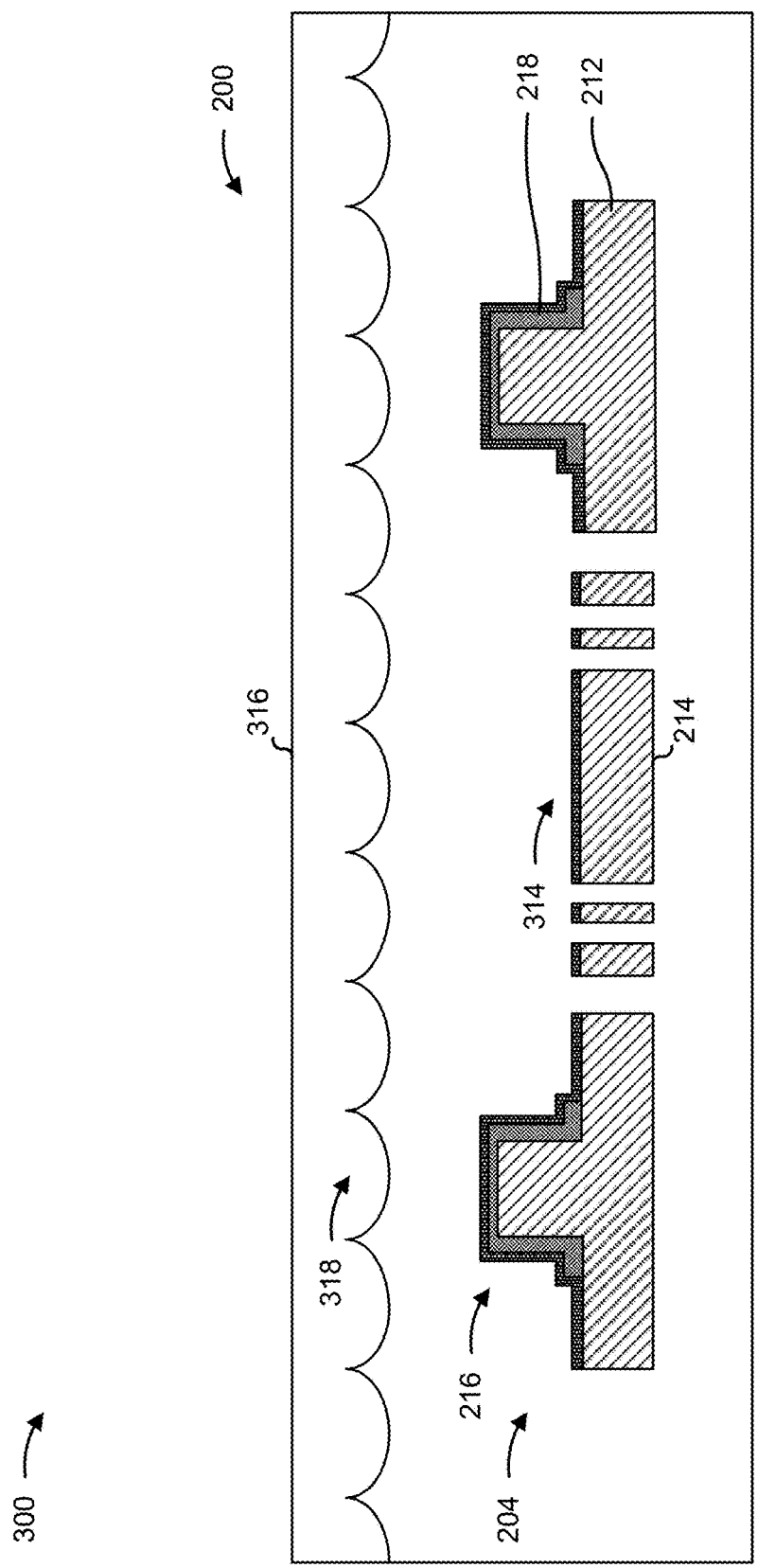
Figure 3N:
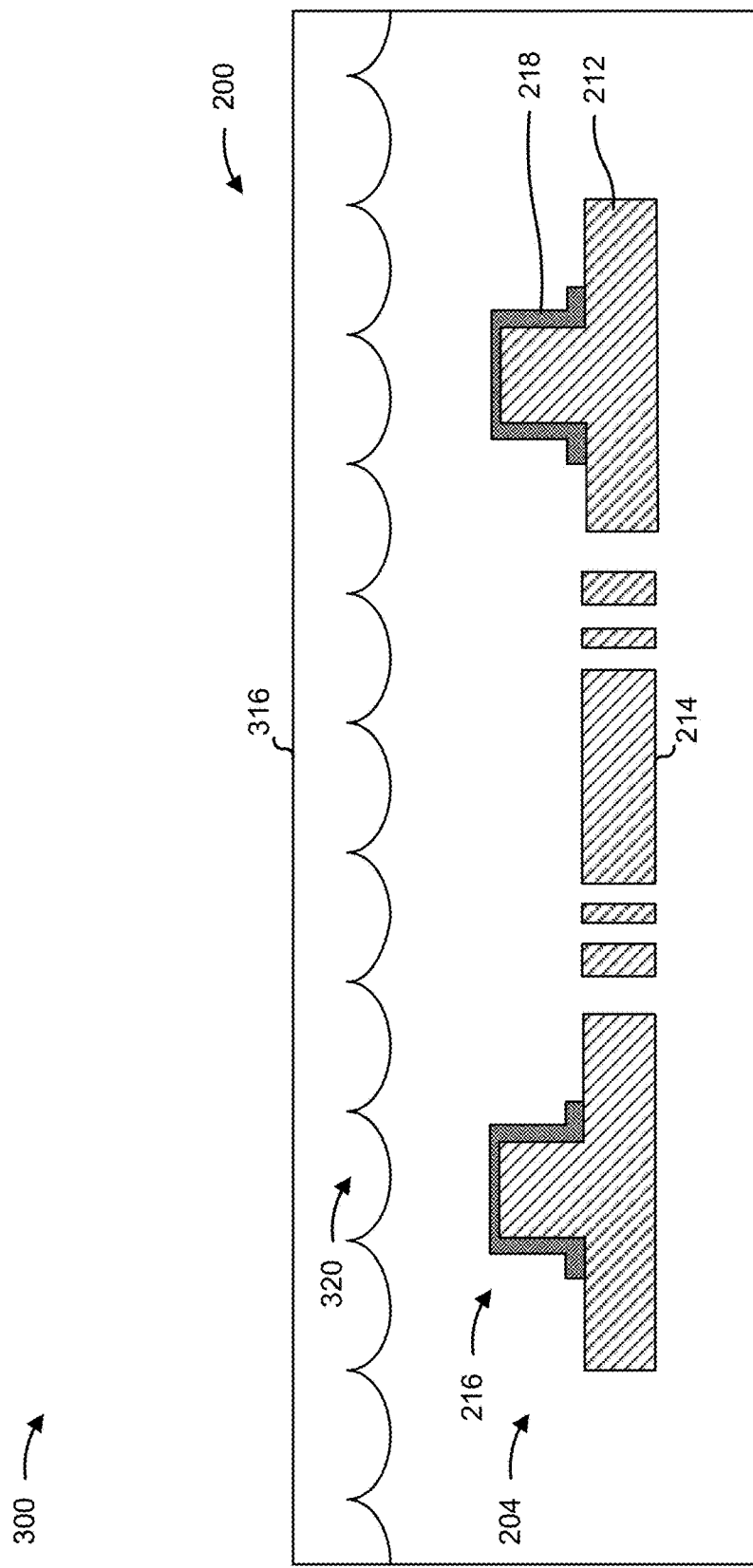
Figure 3O:
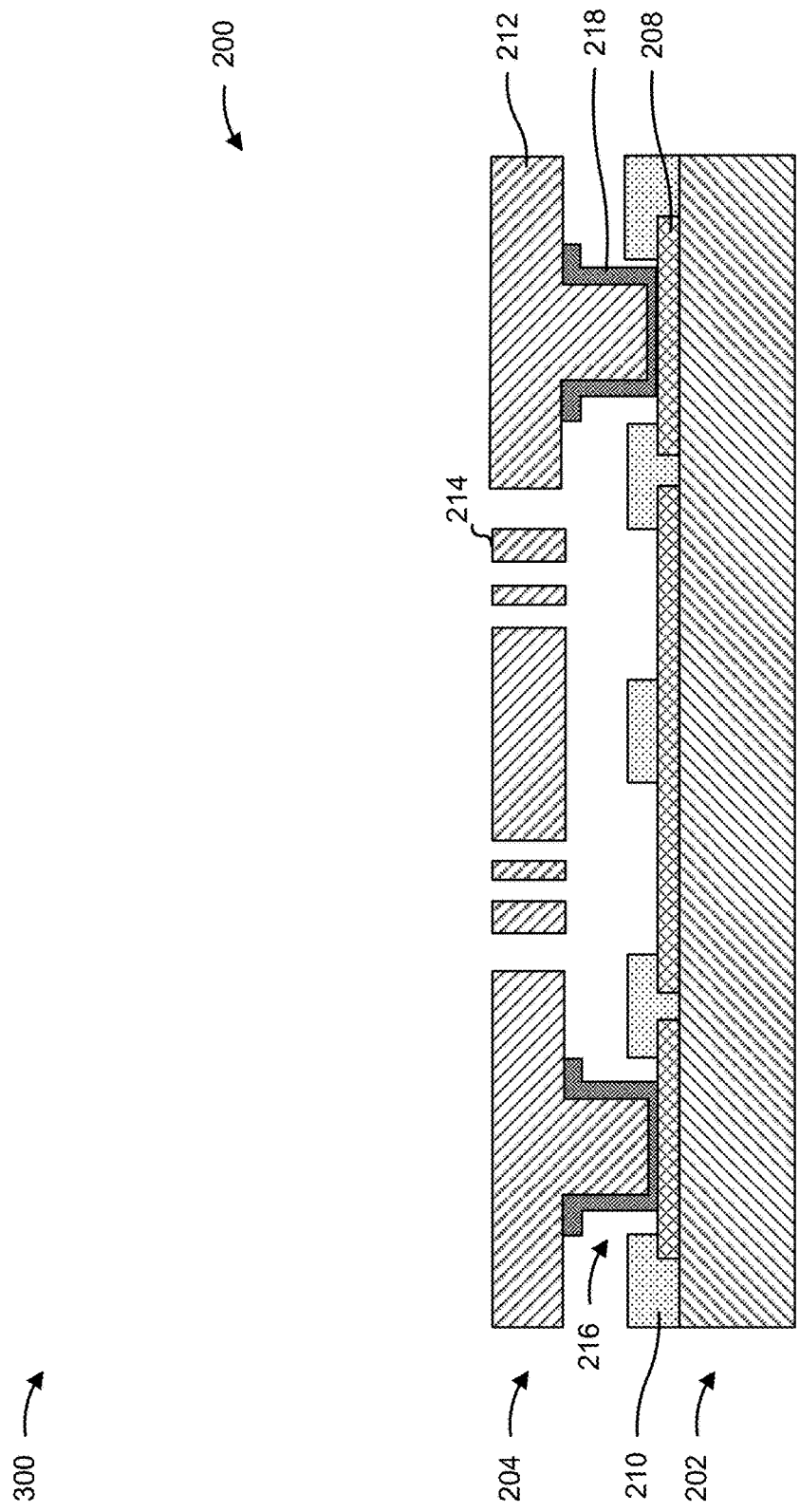
Figure 3P:
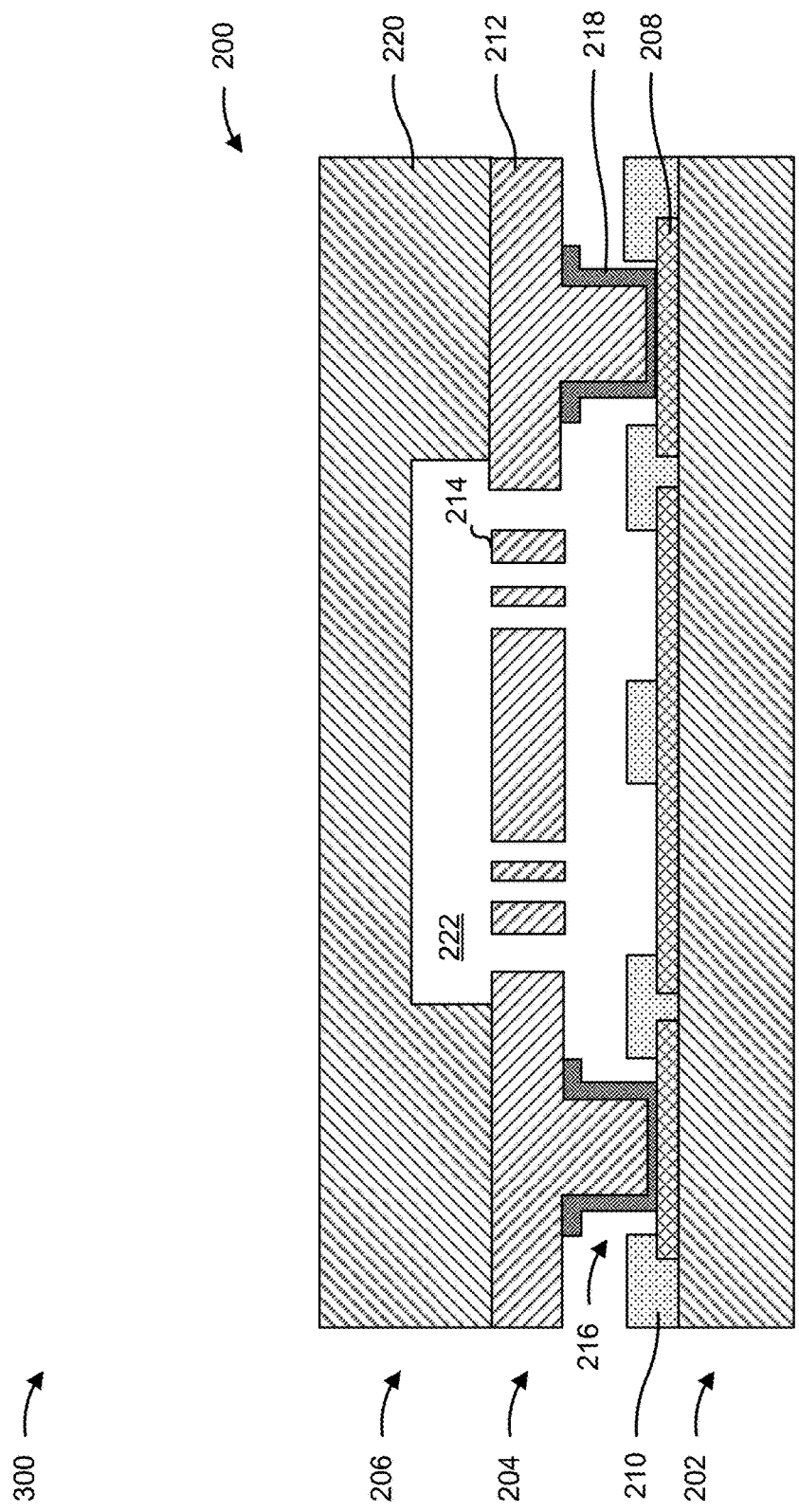

FIGS. 3A-3P are diagrams of an example 300 of forming the MEMS structure 200 of FIG. 2. In some implementations, the one or more semiconductor processing tools 102-110 may perform one or more of the techniques and/or processes described in connection with FIGS. 3A-3P. In some implementations, one or more of the techniques and/or processes described in connection with FIGS. 3A-3P may be performed by other semiconductor processing tools.

As shown in FIG. 3A, a portion of forming the MEMS structure 200 may include forming the substrate 212 of the device wafer 204. This may include forming a crystalline silicon wafer from a seed crystal or other wafer formation techniques.

As shown in FIG. 3B, a semiconductor processing tool (e.g., the deposition tool 102) may form a photoresist layer 302 on the substrate 212. For example, the semiconductor processing tool may form the photoresist layer 302 on the substrate 212 by a spin coating process. In these examples, the substrate 212 may be preheated to remove moisture from the surface of the substrate 212, a primer material may be applied to the surface of the substrate 212 to promote adhesion of the spin coating material, and the substrate 212 may be cooled to room temperature (e.g., using a cooling plate). The substrate 212 may then be placed on a chuck (e.g., a vacuum chuck) to hold and rotate the substrate 212 while the spin coating material is deposited onto the surface of the substrate 212. The rotation (or spinning) of the substrate 212 causes the material to distribute across the surface of the substrate 212 so that the photoresist layer is formed. The substrate 212 may be heated again to remove residual solvents from the photoresist layer.

As shown in FIG. 3C, a pattern 304 may be formed in the photoresist layer 302. In these examples, a semiconductor processing tool (e.g., the exposure tool 104) may expose the photoresist layer 302 to a radiation source, such as a UV source (e.g., a deep UV light source, an extreme UV (EUV) light source, and/or the like), an x-ray source, and/or the like. The semiconductor processing tool may expose the photoresist layer 302 to the radiation source to transfer the pattern 304 from a photomask to the photoresist layer 302.

A semiconductor processing tool (e.g., the developer tool 106) may perform a development process that includes one or more techniques to develop the pattern 304 in the photoresist layer 302. For example, the development process may include rinsing or submerging the substrate 212 and the photoresist layer 302 in a chemical developer, which reacts with the photoresist layer 302 on the wafer to form the pattern 304. After the pattern 304 has been developed, the substrate 212 may be rinsed to remove any residual chemical developer and spin-dried.

As shown in FIG. 3D, the substrate 212 may be etched based on the pattern 304 formed in the photoresist layer 302 to form the support structures 216 of the device wafer 204. For example, a semiconductor processing tool (e.g., the etching tool 108) may perform a wet etching technique (e.g., where the substrate 212 is exposed or submerged in a chemical that etches or removes material from the substrate 212 at a particular etch rate), a dry etching device (e.g., where a plasma is used to sputter material from the substrate 212), or another type of etching technique.

As shown in FIG. 3E, the remaining portions of the photoresist layer 302 may be removed from the substrate 212 after the substrate 212 is etched to form the support structures 216. In some implementations, a solvent or chemical stripper is used to remove the remaining portions of the photoresist layer 302 from the substrate 212. In some implementations, a plasma ashing process is used to remove the remaining portions of the photoresist layer 302. In these examples, a plasma source is used to form a plasma of oxygen ions or fluorine ions to react with the photoresist material. The reaction between the ions in the plasma and the photoresist material causes the photoresist material to form an ash, which is removed using a vacuum pump.

As shown in FIG. 3F, a photoresist layer 306 may be formed on the substrate 212. For example, a semiconductor processing tool (e.g., the deposition tool 102) may form the photoresist layer 306 on the substrate 212 by performing a spin coating process as described above.

As shown in FIG. 3G, a pattern 308 may be formed in the photoresist layer 306. One or more semiconductor processing tools may form the pattern 308 in the photoresist layer 306 by performing one or more of the techniques described above. For example, the exposure tool 104 may expose portions of the photoresist layer 306 to a radiation source, and the developer tool 106 may develop the exposed portions or unexposed portions of the photoresist layer 306 by removing the exposed portions or the unexposed portions of the photoresist layer 306 from the substrate 212 using a chemical developer.

As shown in FIG. 3H, a plurality of germanium layers 218 may be deposited onto the substrate 212 based on the pattern 308 formed in the photoresist layer 306. For example, a semiconductor processing tool (e.g., the deposition tool 102) may deposit the germanium layers 218 onto the substrate 212 using a CVD process, a PVD process, an ALD process, or another type of deposition process. In particular, the semiconductor processing tool may form respective germanium layers 218 over each of the support structures 216 of the substrate 212.

As shown in FIG. 3I, the remaining portions of the photoresist layer 306 may be removed from the substrate 212 after the germanium layers 218 are formed on the support structures 216. In some implementations, a solvent or chemical stripper is used to remove the remaining portions of the photoresist layer 306 from the substrate 212. In some implementations, a plasma ashing process is used to remove the remaining portions of the photoresist layer 306 from the substrate 212.

As shown in FIG. 3J, a photoresist layer 310 may be formed on the substrate 212 and the germanium layers 218. For example, a semiconductor processing tool (e.g., the deposition tool 102) may form the photoresist layer 310 on the substrate 212 and the germanium layers 218 by performing a spin coating process as described above.

As shown in FIG. 3K, a pattern 312 may be formed in the photoresist layer 310. One or more semiconductor processing tools may form the pattern 312 in the photoresist layer 310 by performing one or more of the techniques described above. For example, the exposure tool 104 may expose portions of the photoresist layer 310 to a radiation source, and the developer tool 106 may develop the exposed portions or unexposed portions of the photoresist layer 310 by removing the exposed portions or the unexposed portions of the photoresist layer 310 from the substrate 212 using a chemical developer.

As shown in FIG. 3L, the substrate 212 may be etched based on the pattern 312 formed in the photoresist layer 310 to form the one or more actuators 214 (e.g., the one or more MEMS actuators 214) of the MEMS structure 200 in the substrate 212. For example, a semiconductor processing tool (e.g., the etching tool 108) may perform a wet etching technique (e.g., where the substrate 212 is exposed or submerged in a chemical that etches or removes material from the substrate 212 at a particular etch rate), a dry etching device (e.g., where a plasma is used to sputter material from the substrate 212), or another type of etching technique. The semiconductor processing tool may etch through the substrate 212 based on the pattern 312 such that the one or more actuators 214 are suspended by a lateral connection to a side of the substrate 212. The remaining portions of the photoresist layer 310 may be removed from the substrate 212 and the germanium layers 218 after the substrate 212 is etched to form the one or more actuators 214. In some implementations, a solvent or chemical stripper is used to remove the remaining portions of the photoresist layer 302 from the substrate 212. In some implementations, a plasma ashing process is used to remove the remaining portions of the photoresist layer 302 from the substrate 212.

The processes illustrated and described in connection with FIGS. 3M-3O may be referred to as a eutectic bonding sequence. The eutectic bonding sequence may include various processes to prepare the device wafer 204 to be bonded with the CMOS wafer 202, as well as the eutectic bonding process to bond the device wafer 204 and the CMOS wafer 202.

As shown in FIG. 3M, an oxide layer 314 may form on the device wafer 204 after one or more processes prior to and/or during the eutectic bonding sequence. For example, the oxide layer 314 may form on the surface of the device wafer 204 after removal of the photoresist layer 310. The oxide layer 314 may include a native oxide that is formed on the surface of the device wafer 204 due to a natural oxidation between the silicon of the substrate 212 and oxygen in the air (e.g., atmospheric oxygen), as well as oxidation between the germanium of the germanium layers 218 and the oxygen in the air. The oxidation causes a thin layer of native oxide to form on the device wafer 204 (e.g., silicon dioxide on the silicon portions of the device wafer 204 and germanium dioxide on the germanium layers 218).

As further shown in FIG. 3M, to remove the oxide layer 314 from one or more portions of the device wafer 204 (e.g., from the substrate 212, from the one or more actuators 214, and/or from the germanium layers 218), a semiconductor processing tool (e.g., the etching tool 108) may perform a wet etch of the device wafer 204. The device wafer 204 may be placed in a chamber 316 of the semiconductor processing tool. The chamber 316 may be filled with an acid-based etchant 318. The device wafer 204 may be placed in a bath of the acid-based etchant 318 in the chamber 316 to remove the oxide layer 314 from the one or more portions of the device wafer 204.

The acid-based etchant 318 may include an acidic chemical compound including a plurality of acids, such as a nitric acid, an acetic acid, and/or a phosphoric acid. As an example, the acidic chemical compound of the acid-based etchant 318 may include approximately 4% nitric acid, approximately 19% acetic acid, and approximately 77% phosphoric acid. In some implementations, the acidic chemical compound of the acid-based etchant 318 may be selected to provide a suitable etch rate for the oxide layer 314 while minimizing or maintaining a suitable etch rate of the germanium layers 218 (e.g., 15 angstrom per second) and the silicon of the substrate 212.

The device wafer 204 may remain immersed in the bath of the acid-based etchant 318 for a time duration to remove the oxide layer 314. The wet etch of the device wafer 204 may be performed after the removal of the photoresist layer 310 and without an intervening preclean process to remove the oxide layer 314 after the removal of the photoresist layer 310. To compensate for the lack of preclean process, the device wafer 204 may remain immersed in the bath of the acid-based etchant 318 for an increased time duration to remove the oxide layer 314. The time duration may be increased relative to the time duration that the device wafer 204 would remain immersed in the bath of the acid-based etchant 318 to remove a preclean treatment layer from the device wafer 204 that would have otherwise been formed during the preclean process. In particular, the time duration that the device wafer 204 remains immersed in the bath of the acid-based etchant 318 may be increased from 10 seconds to at least 20 seconds. In some implementations, the time duration that the device wafer 204 remains immersed in the bath of the acid-based etchant 318 is in a range of approximately 20 seconds to approximately 30 seconds to ensure that the oxide layer 314 can be removed by the acid-based etchant 318 without the need for an intervening preclean process while avoiding excessive etching of the germanium layers 218 and the silicon of the substrate 212.

As shown in FIG. 3N, the device wafer 204 may be rinsed after the device wafer 204 is etched to remove any residual acid-based etchant 318 from the device wafer 204. The device wafer 204 may be rinsed in a bath 320 of water (e.g., deionized water), alcohol (e.g., isopropyl alcohol), or an alcohol and water (alcohol/water) mixture. The device wafer 204 is immersed in the bath 320 for another time duration to rinse and remove the residual acid-based etchant 318 from the device wafer 204. After rinsing, the device wafer 204 may be dried with a gas such as a nitrogen gas or another type of gas to dissipate the water, the alcohol, or the alcohol/water mixture.

As shown in FIG. 3O, the device wafer 204 and the CMOS wafer 202 may be bonded. A semiconductor processing tool (e.g., the bonding tool 110) may bond the device wafer 204 and the CMOS wafer 202 by performing a eutectic bonding process to form a eutectic bond between the germanium layers 218 of the device wafer 204 and the metal pads 208 of the CMOS wafer 202. Eutectic bonding may be referred to as a low-temperature bonding in that the bonds between the materials of the germanium layers 218 and the metal pads 208 are formed at a temperature below the melting temperature of the materials of the germanium layers 218 and the metal pads 208. The bonding tool 110 may heat the device wafer 204 and the CMOS wafer 202 such that eutectic bonds are formed between the germanium layers 218 and the metal pads 208. For example, if the metal pads 208 are formed of an aluminum material, the bonding tool 110 may heat the device wafer 204 and the CMOS wafer 202 such that the germanium layers 218 and the metal pads 208 are heated to approximately 425 degrees Celsius to form the eutectic bonds. In some implementations, the eutectic bonding process may be combined with an annealing process (e.g., where the CMOS wafer 202 and the device wafer 204 are heated to a high temperature of 1100 degrees Celsius or more) to reduce the stress at the bonding interfaces resulting from the eutectic bonding process.

As shown in FIG. 3P, the device wafer 204 and the capping wafer 206 may be bonded (e.g., at an opposite side of the device wafer 204 as the bond between the device wafer 204 and the CMOS wafer 202). In some implementations, a semiconductor processing tool (e.g., the bonding tool 110) may form the bond between the device wafer 204 and the capping wafer 206. In some implementations, the bond between the device wafer 204 and the capping wafer 206 is a silicon-silicon bond. In these examples, the bonding tool 110 may use one or more glue layers or bonding layers between the device wafer 204 and the capping wafer 206 to form the silicon-silicon bond. In some implementations, the one or more glue layers include hydrogen-based and/or oxygen-based materials such that silicon hydroxide bonds are formed between the device wafer 204 and the capping wafer 206.

The eutectic bonds between the device wafer 204 and the CMOS wafer 202, and the bond between the device wafer 204 and the capping wafer 206 forms the cavity 222 in which the one or more actuators 214 are hermetically sealed. The cavity 222 permits the one or more actuators 214 to freely move or actuate, and prevents foreign objects and other contamination from damaging the one or more actuators 214.

As indicated above, FIGS. 3A-3P are provided as an example. Other examples may differ from what is described with regard to FIGS. 3A-3P.

Figure 4:
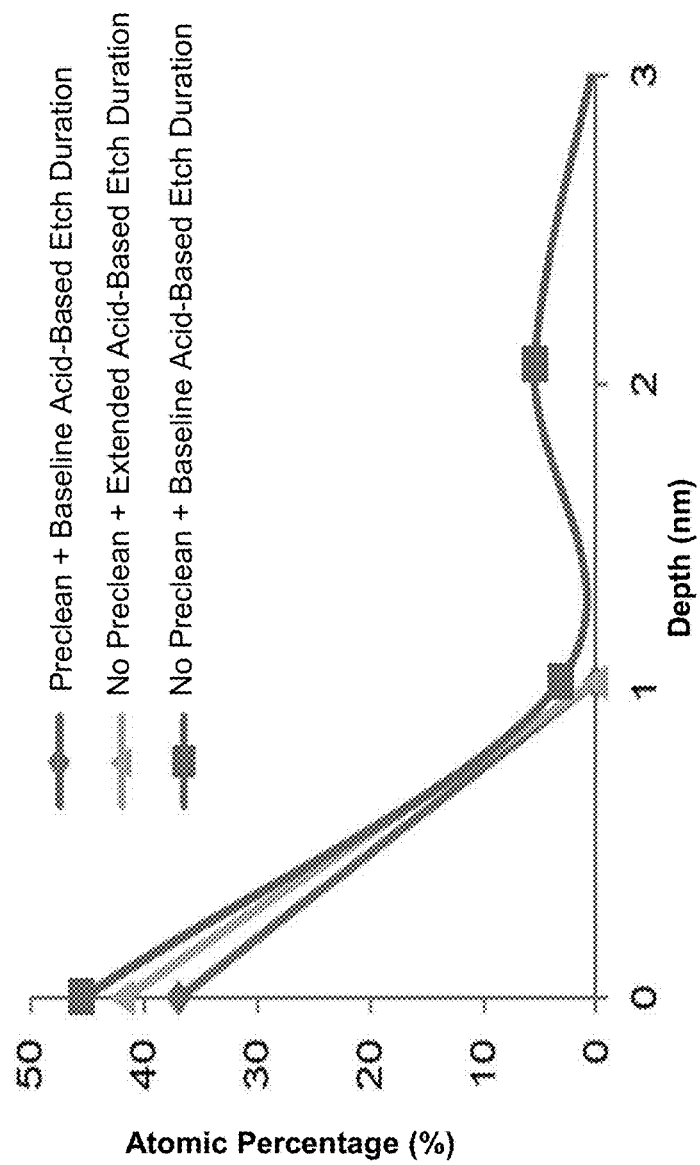
FIG. 4 is a diagram of an example of X-ray photoelectron spectroscopy (XPS) data associated with a plurality of processes for forming a MEMS structure.

FIG. 4 is a diagram of an example 400 of X-ray photoelectron spectroscopy (XPS) data associated with a plurality of processes for forming a MEMS structure. The XPS data illustrates the atomic percentage of oxide material as a function of depth (in nanometers) in a MEMS structure for a eutectic bonding sequence including a preclean process and a baseline acid-based etch duration, for a eutectic bonding sequence without a preclean process and with a baseline acid-based etch duration, and for a eutectic bonding sequence without a preclean process and with an extended acid-based etch duration as described herein.

As shown in FIG. 4, the depth of oxide on the MEMS structure for the eutectic bonding sequence including a preclean process and the baseline acid-based etch duration is approximately 1 nanometer. Removing the preclean process while maintain the baseline acid-based etch duration shows an increased oxide depth of up to 3 nanometers or more. However, increasing the acid-based etch duration to the extended acid-based etch duration while removing the preclean process, as described herein, produces an oxide depth that similar to the preclean process and the baseline acid-based etch duration while providing a less complex eutectic bonding sequence.

As indicated above, FIG. 4 is provided as an example. Other examples may differ from what is described with regard to FIG. 4.

Figure 5:
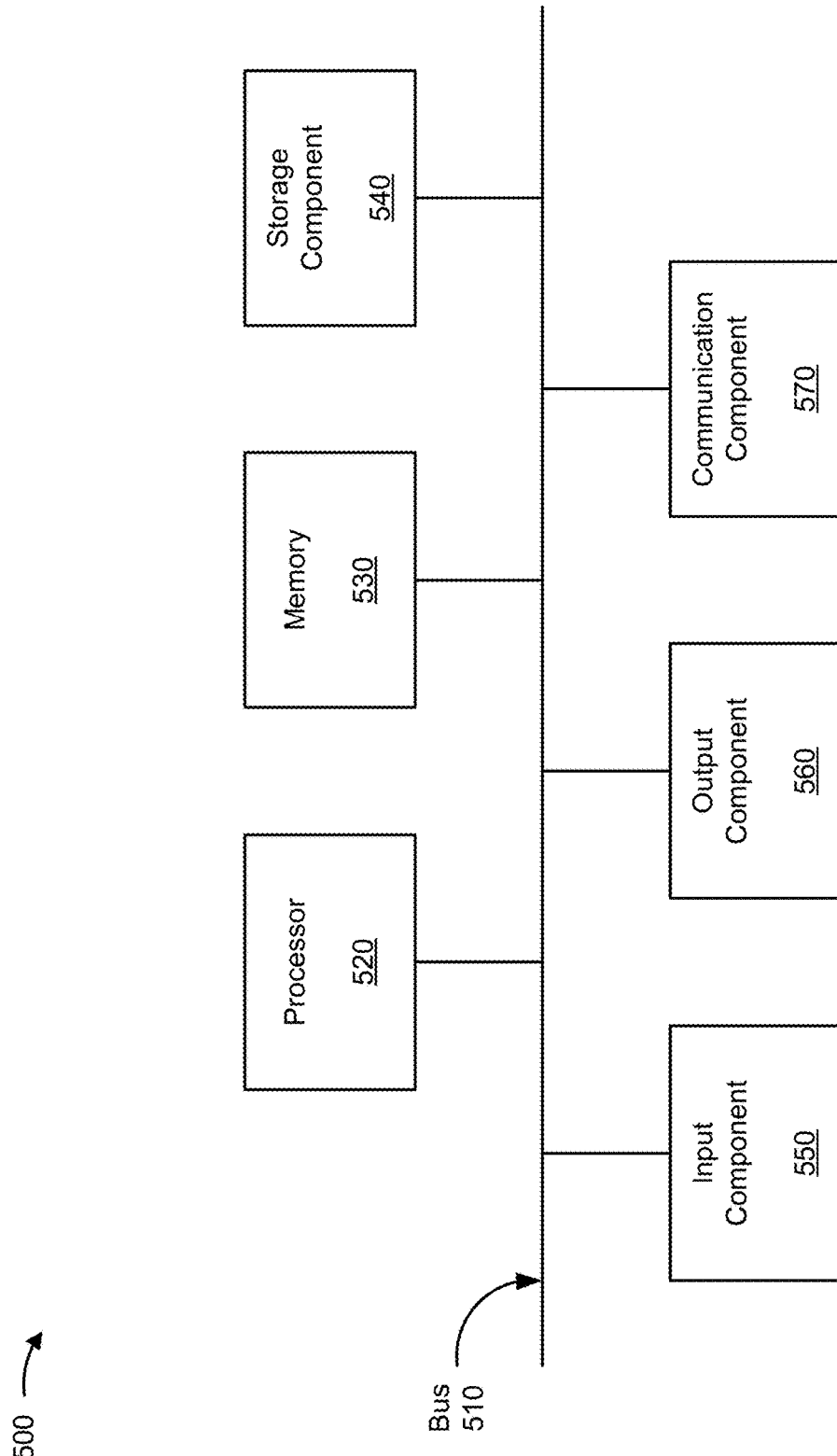
FIG. 5 is a diagram of example components of one or more devices of FIG. 1.

FIG. 5 is a diagram of example components of a device 500. In some implementations, one or more of the semiconductor processing tools 102-110 and/or the wafer/die transport tool 112 may include one or more devices 500 and/or one or more components of device 500. As shown in FIG. 5, device 500 may include a bus 510, a processor 520, a memory 530, a storage component 540, an input component 550, an output component 560, and a communication component 570.

Bus 510 includes a component that enables wired and/or wireless communication among the components of device 500. Processor 520 includes a central processing unit, a graphics processing unit, a microprocessor, a controller, a microcontroller, a digital signal processor, a field-programmable gate array, an application-specific integrated circuit, and/or another type of processing component. Processor 520 is implemented in hardware, firmware, or a combination of hardware and software. In some implementations, processor 520 includes one or more processors capable of being programmed to perform a function. Memory 530 includes a random access memory, a read only memory, and/or another type of memory (e.g., a flash memory, a magnetic memory, and/or an optical memory).

Storage component 540 stores information and/or software related to the operation of device 500. For example, storage component 540 may include a hard disk drive, a magnetic disk drive, an optical disk drive, a solid state disk drive, a compact disc, a digital versatile disc, and/or another type of non-transitory computer-readable medium. Input component 550 enables device 500 to receive input, such as user input and/or sensed inputs. For example, input component 550 may include a touch screen, a keyboard, a keypad, a mouse, a button, a microphone, a switch, a sensor, a global positioning system component, an accelerometer, a gyroscope, an actuator, and/or the like. Output component 560 enables device 500 to provide output, such as via a display, a speaker, and/or one or more light-emitting diodes. Communication component 570 enables device 500 to communicate with other devices, such as via a wired connection and/or a wireless connection. For example, communication component 570 may include a receiver, a transmitter, a transceiver, a modem, a network interface card, an antenna, and/or the like.

Device 500 may perform one or more processes described herein. For example, a non-transitory computer-readable medium (e.g., memory 530 and/or storage component 540) may store a set of instructions (e.g., one or more instructions, code, software code, program code, and/or the like) for execution by processor 520. Processor 520 may execute the set of instructions to perform one or more processes described herein. In some implementations, execution of the set of instructions, by one or more processors 520, causes the one or more processors 520 and/or the device 500 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
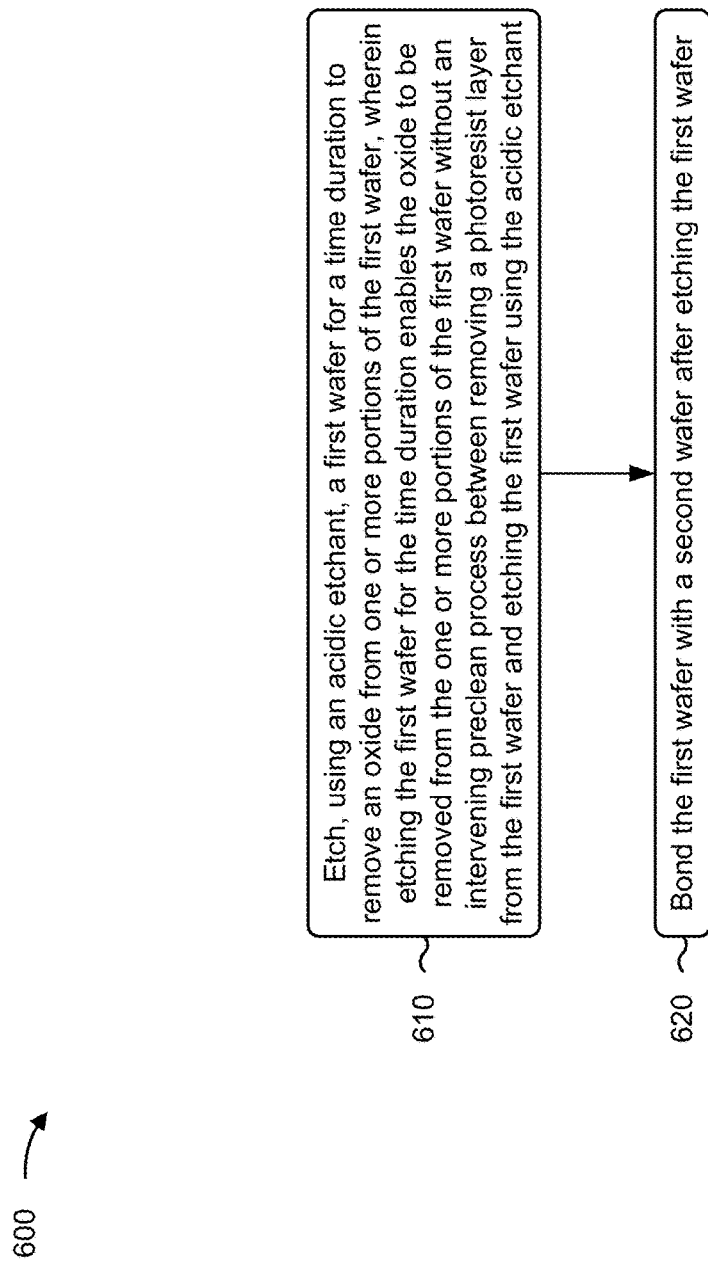
FIGS. 6-8 are flowcharts of example processes relating to forming a MEMS structure.

FIG. 6 is a flowchart of an example process 600 associated with forming a MEMS structure. In some implementations, one or more process blocks of FIG. 6 may be performed by one or more semiconductor processing tools (e.g., one or more of the semiconductor processing tools 102-110). Additionally, or alternatively, one or more process blocks of FIG. 6 may be performed by one or more components of device 500, such as processor 520, memory 530, storage component 540, input component 550, output component 560, and/or communication component 570.

As shown in FIG. 6, process 600 may include etching, using an acidic etchant, a first wafer for a time duration range to remove an oxide from one or more portions of the first wafer, where etching the first wafer for the time duration enables the oxide to be removed from the one or more portions of the first wafer without an intervening preclean process between removing a photoresist layer from the first wafer and etching the first wafer using the acidic etchant (block 610). For example, a semiconductor processing tool (e.g., the etching tool 108) may etch, using an acidic etchant 318, a first wafer 204 for a time duration to remove an oxide layer 314 from one or more portions of the first wafer 204, as described above. In some implementations, etching the first wafer 204 for the time duration enables the oxide layer 314 to be removed from the one or more portions of the first wafer 204 without an intervening preclean process between removing a photoresist layer 310 from the first wafer 204 and etching the first wafer 204 using the acidic etchant 318.

As further shown in FIG. 6, process 600 may include bonding the first wafer with a second wafer after etching the first wafer (block 620). For example, a semiconductor processing tool (e.g., bonding tool 110) may bond the first wafer 204 with a second wafer 202 after etching the first wafer 204, as described above.

Process 600 may include additional implementations, such as any single implementation or any combination of implementations described below and/or in connection with one or more other processes described elsewhere herein.

In a first implementation, the time duration is in a range of approximately 20 seconds to approximately 30 seconds. In a second implementation, alone or in combination with the first implementation, the first wafer 204 includes a MEMS device wafer, and the second wafer 202 includes a MEMS circuitry wafer. In a third implementation, alone or in combination with one or more of the first and second implementations, bonding the first wafer 204 with the second wafer 202 includes performing eutectic bonding of the first wafer 204 and the second wafer 202.

In a fourth implementation, alone or in combination with one or more of the first through third implementations, the one or more portions of the first wafer 204 include at least one of one or more silicon portions (e.g., the substrate 212, the one or more actuators 214) of the first wafer 204, or one or more germanium portions (e.g., germanium layers 218) of the first wafer 204. In a fifth implementation, alone or in combination with one or more of the first through fourth implementations, the acidic etchant 318 includes at least one of a nitric acid, an acetic acid, or a phosphoric acid. In a sixth implementation, alone or in combination with one or more of the first through fifth implementations, process 600 includes rinsing the first wafer 204 in an alcohol/water bath 320 for a time duration after etching the first wafer 204, and drying the first wafer 204 after rinsing the first wafer 204, where bonding the first wafer 204 with the second wafer 202 includes bonding the first wafer 204 with the second wafer 202 after drying the first wafer 204.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

Figure 7:
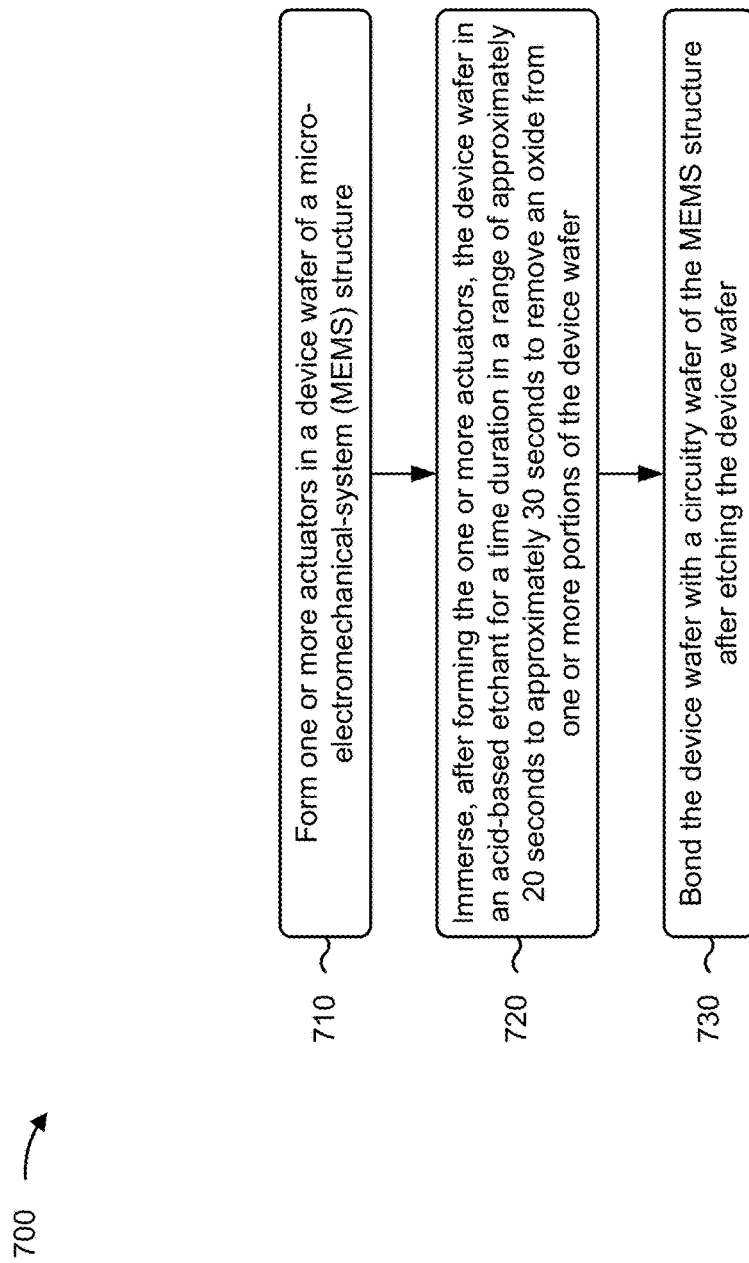

FIG. 7 is a flowchart of an example process 700 associated with forming a MEMS structure. In some implementations, one or more process blocks of FIG. 7 may be performed by one or more semiconductor processing tools (e.g., one or more of the semiconductor processing tools 102-110). Additionally, or alternatively, one or more process blocks of FIG. 7 may be performed by one or more components of device 500, such as processor 520, memory 530, storage component 540, input component 550, output component 560, and/or communication component 570.

As shown in FIG. 7, process 700 may include forming one or more actuators 214 in a device wafer of a MEMS structure 200 (block 710). For example, a semiconductor processing tool (e.g., the deposition tool 102, the exposure tool 104, the developer tool 106, the etching tool 108, and/or another semiconductor processing tool) may form one or more actuators 214 in a device wafer 204 of a MEMS structure 200, as described above.

As further shown in FIG. 7, process 700 may include immersing, after forming the one or more actuators, the device wafer in an acid-based etchant for a time duration in a range of approximately 20 seconds to approximately 30 seconds to remove an oxide from one or more portions of the device wafer (block 720). For example, a semiconductor processing tool (e.g., the etching tool 108) may immerse, after forming the one or more actuators 214, the device wafer 204 in an acid-based etchant 318 for a time duration in a range of approximately 20 seconds to approximately 30 seconds to remove an oxide layer 314 from one or more portions (e.g., the substrate 212, the one or more actuators 214, and/or the germanium layers 218) of the device wafer, as described above.

As further shown in FIG. 7, process 700 may include bonding the device wafer with a circuitry wafer of the MEMS structure after etching the device wafer (block 730). For example, a semiconductor processing tool (e.g., a bonding tool 110) may bond the device wafer 204 with a circuitry wafer 202 of the MEMS structure 200 after etching the device wafer 204, as described above.

Process 700 may include additional implementations, such as any single implementation or any combination of implementations described below and/or in connection with one or more other processes described elsewhere herein.

In a first implementation, forming the one or more actuators 214 includes forming a photoresist layer 310 on a surface of the device wafer 204, etching (e.g., using the etching tool 108) the device wafer 204 to form the one or more actuators 214 based on the photoresist layer 310 (e.g., based at least in part on the pattern 312 formed in the photoresist layer 310), and performing a plasma ashing process to remove the photoresist layer 310. In a second implementation, alone or in combination with the first implementation, immersing the device wafer 204 in the acid-based etchant 318 for the time duration includes immersing the device wafer 204 in the acid-based etchant 318 for the time duration after performing the plasma ashing process without an intervening process to form a preclean treatment layer on the device wafer 204. In a third implementation, alone or in combination with one or more of the first and second implementations, process 700 includes rinsing the device wafer 204 with deionized water 320 for another time duration after etching the device wafer 204, and drying the device wafer after rinsing the device wafer (e.g., with the deionized water bath 318), where bonding the device wafer 204 with the circuitry wafer 202 includes bonding the device wafer 204 with the circuitry wafer 202 after drying the device wafer 204.

In a fourth implementation, alone or in combination with one or more of the first through third implementations, process 700 includes bonding (e.g., using the bonding tool 110) the device wafer 204 with a capping wafer 206 on an opposite side of the device wafer 204 to which the circuitry wafer 202 is bonded, where the device wafer 204, the circuitry wafer 202, and the capping wafer 206 form a cavity 222 for the one or more actuators 214. In a fifth implementation, alone or in combination with one or more of the first through fourth implementations, the one or more portions of the device wafer 204 comprise one or more silicon portions (e.g., the substrate 212 and/or the one or more actuators 214) of the device wafer 204, and one or more germanium portions (e.g., the germanium layers 218) of the device wafer 204. In a sixth implementation, alone or in combination with one or more of the first through fifth implementations, the acid-based etchant 318 includes approximately 4% nitric acid, approximately 19% acetic acid, and approximately 77% phosphoric acid.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Figure 8:
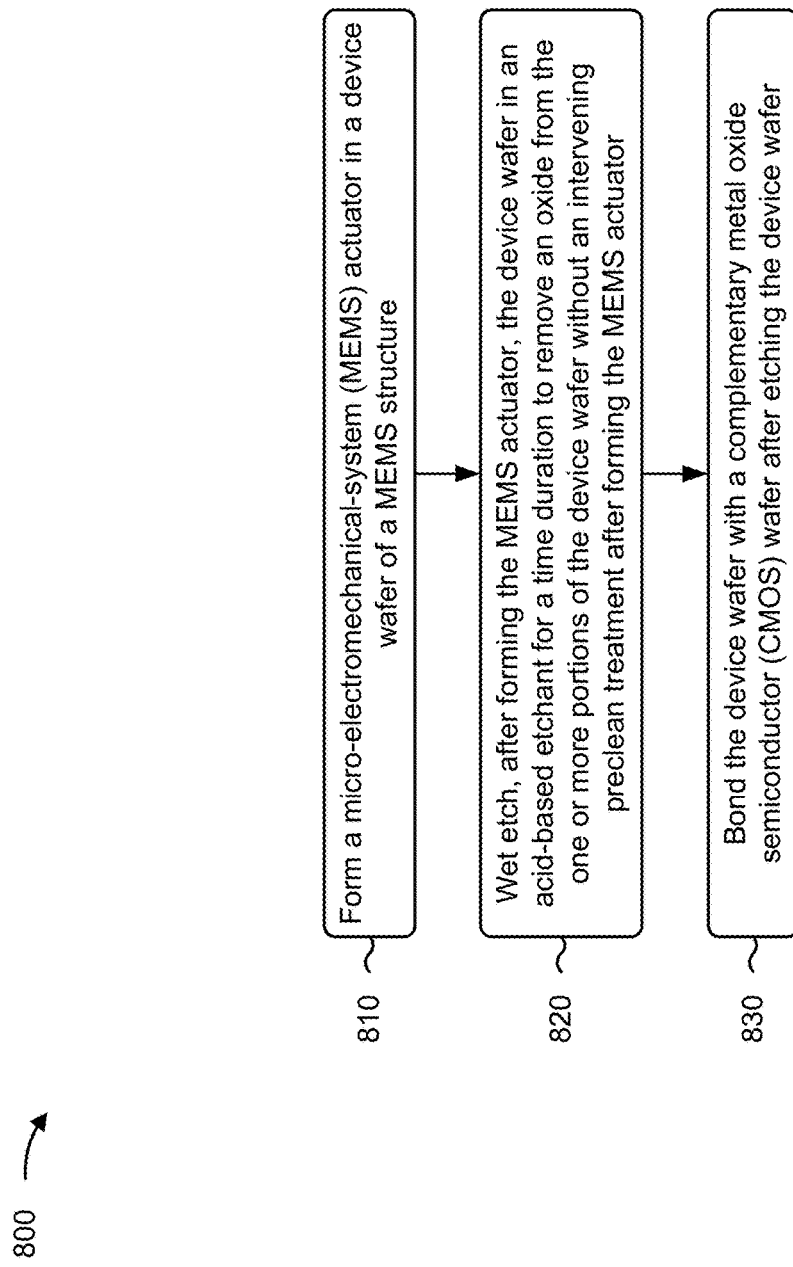

FIG. 8 is a flowchart of an example process 800 associated with forming a MEMS structure. In some implementations, one or more process blocks of FIG. 8 may be performed by one or more semiconductor processing tools (e.g., one or more of the semiconductor processing tools 102-110). Additionally, or alternatively, one or more process blocks of FIG. 8 may be performed by one or more components of device 500, such as processor 520, memory 530, storage component 540, input component 550, output component 560, and/or communication component 570.

As shown in FIG. 8, process 800 may include forming a MEMS actuator in a device wafer of a MEMS structure (block 810). For example, a semiconductor processing tool (e.g., the deposition tool 102, the exposure tool 104, the developer tool 106, the etching tool 108, and/or another semiconductor processing tool) may form a MEMS actuator 214 in a device wafer 204 of a MEMS structure 200, as described above.

As further shown in FIG. 8, process 800 may include wet etching, after forming the MEMS actuator, the device wafer in an acid-based etchant for a time duration to remove an oxide from one or more portions of the device wafer without an intervening preclean treatment after forming the MEMS actuator (block 820). For example, a semiconductor processing tool (e.g., the etching tool 108) may wet etch, after forming the MEMS actuator 214, the device wafer 204 in an acid-based etchant 318 for a time duration to remove an oxide from one or more portions of the device wafer 204 without an intervening preclean treatment after forming the MEMS actuator 214, as described above.

As further shown in FIG. 8, process 800 may include bonding the device wafer with a CMOS wafer after etching the device wafer (block 830). For example, a semiconductor processing tool (e.g., the bonding tool 110) may bond the device wafer 204 with a CMOS wafer 202 after etching the device wafer 204, as described above.

Process 800 may include additional implementations, such as any single implementation or any combination of implementations described below and/or in connection with one or more other processes described elsewhere herein.

In a first implementation, acid-based etchant 318 includes a combination of a nitric acid, an acetic acid, and a phosphoric acid. In a second implementation, alone or in combination with the first implementation, the one or more portions of the device wafer 204 include one or more germanium portions (e.g., germanium layers 218) of the device wafer 204. In a third implementation, alone or in combination with one or more of the first and second implementations, wetting etching the device wafer 204 without an intervening preclean treatment reduces a likelihood of stiction of the MEMS actuator 214 to a wall of a cavity 222 within the MEMS structure 200 relative to performing an intervening preclean treatment.

In a fourth implementation, alone or in combination with one or more of the first through third implementations, bonding the device wafer 204 with the CMOS wafer 202 includes forming a eutectic bond between a germanium layer 218 of the device wafer 204 and a metal pad 208 of the CMOS wafer 202. In a fifth implementation, alone or in combination with one or more of the first through fourth implementations, wetting etching the device wafer 204 without an intervening preclean treatment reduces a likelihood of plasma damage to the device wafer 204 relative to performing an intervening preclean treatment. In a sixth implementation, alone or in combination with one or more of the first through fifth implementations, the time duration is in a range of approximately 20 seconds to approximately 30 seconds.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

In this way, a preclean process may be omitted from a eutectic bonding sequence. To remove oxide from one or more surfaces of a device wafer of a MEMS structure, a duration of an acid-based etch process in the eutectic bonding sequence may be increased relative to the duration of the acid-based etch process when the preclean process is performed. The increased duration of the acid-based etch process enables the acid-based etch process to remove the oxide from the one or more surfaces of the device wafer without the use of a preceding preclean process. This reduces the complexity and cycle time of the eutectic bonding sequence, reduces the risk of stiction between suspended mechanical components of the MEMS structure, and/or reduces the likelihood that a MEMS structure may be rendered defective or inoperable during manufacturing, which increases process yield.

As described in greater detail above, some implementations described herein provide a method. The method includes etching, using an acidic etchant, a first wafer for a time duration to remove an oxide from one or more portions of the first wafer. Etching the first wafer for the time duration enables the oxide to be removed from the one or more portions of the first wafer without an intervening preclean process between removing a photoresist layer from the first wafer and etching the first wafer using the acidic etchant. The method includes bonding the first wafer with a second wafer after etching the first wafer.

As described in greater detail above, some implementations described herein provide a method. The method includes forming one or more actuators in a device wafer of a MEMS structure. The method includes immersing, after forming the one or more actuators, the device wafer in an acid-based etchant for a time duration in a range of approximately 20 seconds to approximately 30 seconds to remove an oxide from one or more portions of the device wafer. The method includes bonding the device wafer with a circuitry wafer of the MEMS structure after etching the device wafer.

As described in greater detail above, some implementations described herein provide a method. The method includes forming a MEMS actuator in a device wafer of a MEMS structure. The method includes wet etching, after forming the MEMS actuator and without an intervening preclean treatment, the device wafer in an acid-based etchant for at least 20 seconds to remove an oxide from one or more portions of the device wafer. The method includes bonding the device wafer with a CMOS wafer after etching the device wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    removing a photoresist layer from a first wafer;
    etching, using an acidic etchant, the first wafer for a time duration to remove an oxide from one or more portions of the first wafer,
        wherein etching the first wafer for the time duration enables the oxide to be removed from the one or more portions of the first wafer without an intervening preclean process between removing the photoresist layer from the first wafer and etching the first wafer using the acidic etchant;
    bonding the first wafer with a second wafer after etching the first wafer; and
    bonding the first wafer with a third wafer on an opposite side of the first wafer to which the second wafer is bonded,
        wherein the first wafer, the second wafer, and the third wafer form a cavity.

2. The method of claim 1, wherein the time duration is in a range of approximately 20 seconds to approximately 30 seconds.

3. The method of claim 1, wherein the first wafer comprises a micro-electromechanical-system (MEMS) device wafer; and
    wherein the second wafer comprises a MEMS circuitry wafer.

4. The method of claim 1, wherein bonding the first wafer with the second wafer comprises:
    performing eutectic bonding of the first wafer and the second wafer.

5. The method of claim 1, wherein the one or more portions of the first wafer comprise at least one of:
    one or more silicon portions of the first wafer, or
    one or more germanium portions of the first wafer.

6. The method of claim 1, wherein the acidic etchant includes at least one of:
    a nitric acid,
    an acetic acid, or
    a phosphoric acid.

7. The method of claim 1, further comprising:
    rinsing the first wafer in an alcohol/water bath for another time duration after etching the first wafer; and
    drying the first wafer after rinsing the first wafer,
        wherein bonding the first wafer with the second wafer comprises:
            bonding the first wafer with the second wafer after drying the first wafer.

8. A method, comprising:
    forming one or more actuators in a device wafer of a micro-electromechanical-system (MEMS) structure;
    immersing, after forming the one or more actuators, the device wafer in an acid-based etchant for a time duration in a range of approximately 20 seconds to approximately 30 seconds to remove an oxide from one or more portions of the device wafer;
    bonding the device wafer with a circuitry wafer of the MEMS structure after etching the device wafer; and
    bonding the device wafer with a capping wafer on an opposite side of the device wafer to which the circuitry wafer is bonded,
        wherein the device wafer, the circuitry wafer, and the capping wafer form a cavity for the one or more actuators.

9. The method of claim 8, wherein forming the one or more actuators comprises:
    forming a photoresist layer on a surface of the device wafer;
    etching the device wafer to form the one or more actuators based on the photoresist layer; and
    performing a plasma ashing process to remove the photoresist layer.

10. The method of claim 9, wherein immersing the device wafer in the acid-based etchant for the time duration comprises:
    immersing the device wafer in the acid-based etchant for the time duration after performing the plasma ashing process without an intervening process to form a preclean treatment layer on the device wafer.

11. The method of claim 8, further comprising:
    rinsing the device wafer with deionized water for another time duration after etching the device wafer; and
    drying the device wafer after rinsing the device wafer,
        wherein bonding the device wafer with the circuitry wafer comprises:

bonding the device wafer with the circuitry wafer after drying the device wafer.

12. The method of claim 8, wherein the one or more portions of the device wafer comprise:
   one or more silicon portions of the device wafer, and
   one or more germanium portions of the device wafer.

13. The method of claim 8, wherein the acid-based etchant comprises:
   approximately 4% nitric acid,
   approximately 19% acetic acid, and
   approximately 77% phosphoric acid.

14. A method, comprising:
   forming a micro-electromechanical-system (MEMS) actuator in a device wafer of a MEMS structure;
   wet etching, after forming the MEMS actuator, the device wafer in an acid-based etchant for a time duration to remove an oxide from one or more portions of the device wafer without an intervening preclean treatment after forming the MEMS actuator; and
   bonding the device wafer with a complementary metal oxide semiconductor (CMOS) wafer after etching the device wafer; and
   bonding the device wafer with a capping wafer on an opposite side of the device wafer to which the CMOS wafer is bonded,
   wherein the device wafer, the CMOS wafer, and the capping wafer form a cavity for the MEMS actuator.

15. The method of claim 14, wherein the acid-based etchant includes a combination of:
   a nitric acid,
   an acetic acid, and
   a phosphoric acid.

16. The method of claim 14, wherein the one or more portions of the device wafer comprise one or more germanium portions of the device wafer.

17. The method of claim 14, wherein bonding the device wafer with the CMOS wafer comprises:
   forming a eutectic bond between a germanium layer of the device wafer and a metal pad of the CMOS wafer.

18. The method of claim 14, wherein the time duration is in a range of approximately 20 seconds to approximately 30 seconds.

19. The method of claim 1, wherein the time duration is at least 20 seconds.

20. The method of claim 8, wherein bonding the device wafer with the circuitry wafer comprises:
   performing eutectic bonding.

* * * * *